US012593649B2

(12) United States Patent
Choi et al.

(10) Patent No.: US 12,593,649 B2
(45) Date of Patent: Mar. 31, 2026

(54) APPARATUS AND METHOD FOR TREATING SUBSTRATE

(71) Applicant: SEMES CO., LTD., Cheonan-si (KR)

(72) Inventors: Jun Young Choi, Cheongju-si (KR); Gui Su Park, Cheonan-si (KR); Young Jin Jang, Cheonan-si (KR); Jun Hyun Lim, Seoul (KR)

(73) Assignee: Semes Co., Ltd., Chungcheongnam-do (KR)

( * ) Notice: Subject to any disclaimer, the term of this patent is extended or adjusted under 35 U.S.C. 154(b) by 455 days.

(21) Appl. No.: 17/952,774

(22) Filed: Sep. 26, 2022

(65) Prior Publication Data

US 2023/0096569 A1 Mar. 30, 2023

(30) Foreign Application Priority Data

Sep. 29, 2021 (KR) ........................ 10-2021-0129103

(51) Int. Cl.
| | |
|---|---|
| *H01L 21/677* | (2006.01) |
| *B08B 3/04* | (2006.01) |
| *B08B 13/00* | (2006.01) |
| *B25J 11/00* | (2006.01) |
| *H01L 21/687* | (2006.01) |

(52) U.S. Cl.
CPC .......... *H01L 21/67718* (2013.01); *B08B 3/04* (2013.01); *B08B 13/00* (2013.01); *B25J 11/0095* (2013.01); *H01L 21/68721* (2013.01)

(58) Field of Classification Search
None
See application file for complete search history.

(56) References Cited

U.S. PATENT DOCUMENTS

| | | | |
|---|---|---|---|
| 2007/0182437 A1 | 8/2007 | Shim et al. | |
| 2012/0006726 A1* | 1/2012 | Kusuhara ............. | B28D 5/0082 |
| | | | 414/801 |
| 2018/0166310 A1* | 6/2018 | Onzuka ............. | H01L 21/67754 |

FOREIGN PATENT DOCUMENTS

| | | |
|---|---|---|
| CN | 102272913 A | 12/2011 |
| CN | 103537402 A | 1/2014 |
| CN | 108231640 A | 6/2018 |
| CN | 111081591 A | 4/2020 |

(Continued)

OTHER PUBLICATIONS

KR 20160015544 A Espacenet translation, Wafer Turning Apparatus After Chemical Mechanical Polishing Process and Substrate Transferring Method Using Same, Kim (Year: 2016).*

(Continued)

*Primary Examiner* — Cristi J Tate-Sims
(74) *Attorney, Agent, or Firm* — Harness, Dickey & Pierce, P.L.C.

(57) ABSTRACT

The inventive concept provides a substrate treating apparatus. The substrate treating apparatus includes a treating bath having an accommodation space for accommodating a treating liquid; a support member configured to support at least one substrate in a vertical posture at the accommodation space; and a posture changing robot configured to change a posture of a substrate immersed in the treating liquid from the vertical posture to a horizontal posture, and wherein the posture changing robot comprises: a body configured to hold the substrate thereon; and a liquid supply member configured to supply a wetting liquid to the substrate placed on the body.

20 Claims, 18 Drawing Sheets

(56) References Cited

FOREIGN PATENT DOCUMENTS

| KR | 10-0699918 | 3/2007 |
|---|---|---|
| KR | 10-2007-0069819 A | 7/2007 |
| KR | 101213967 B1 | 12/2012 |
| KR | 10-1267929 | 5/2013 |
| KR | 10-2016-0015544 A | 2/2016 |
| KR | 10-2020-0068081 A | 6/2020 |

OTHER PUBLICATIONS

Office Action for Korean Application No. 10-2021-0129103 dated Mar. 27, 2023.
Office Action issued Nov. 15, 2025 in Chinese Application No. 202211193995.9.

* cited by examiner

APPARATUS AND METHOD FOR TREATING SUBSTRATE

CROSS-REFERENCE TO RELATED APPLICATIONS

A claim for priority under 35 U.S.C. § 119 is made to Korean Patent Application No. 10-2021-0129103 filed on Sep. 29, 2021, in the Korean Intellectual Property Office, the entire contents of which are hereby incorporated by reference.

BACKGROUND

Embodiments of the inventive concept described herein relate to a substrate treating apparatus.

In order to manufacture a semiconductor element, a desired pattern is formed on a substrate such as a wafer through various processes such as a photolithography process, an etching process, an ashing process, an ion implantation process, and a thin film deposition process on the substrate. Various treating liquids and treating gases are used in each process, and particles and process by-products are generated during a process. In order to remove a thin film, particles, and process by-products on the substrate from the substrate, a liquid treatment process is performed on the substrate before and after each process. In a general liquid treatment process, the substrate is treated with a chemical and a rinsing liquid and then dried. In the liquid treatment process, a SiN on the substrate may be stripped.

In addition, a substrate treating method using a treating liquid such as a chemical and/or a rinsing liquid can be divided into a batch-type treating method of treating a plurality of substrates in batches and a single-type treating method of treating substrates one by one.

In the batch-type treating method for collectively treating the plurality of substrates, a substrate treatment is performed by collectively immersing the plurality of substrates in a vertical posture in a treating bath in which a chemical or a rinsing liquid is stored. For this reason, a mass productivity of the substrate treatment is excellent, and a treating quality between each substrate is uniform. However, in the batch-type treating method, a plurality of substrates having a pattern formed on a top surface are immersed in the vertical posture. Accordingly, if the pattern formed on the substrate has a high aspect ratio, a pattern learning phenomenon may occur at the pattern formed on the substrate during a process such as lifting the substrate. In addition, if a drying treatment is not quickly performed within a short period of time in a state in which the plurality of substrates are exposed to the air, a water mark may be generated in some of the plurality of substrates exposed to the air.

On the other hand, in the case of the single-type treating method of treating substrates one by one, a substrate treatment is performed to supply a chemical or a rinsing liquid to a single substrate rotating in a horizontal posture. Also, in the single-type treating method, since a transferred substrate maintains the horizontal posture, a risk of the pattern leaning phenomenon is reduced, and the substrate is treated one by one and a treated substrate is immediately dried or liquid-treated, so a risk of the water mark is reduced. However, in the case of the single-type treating method, the mass productivity of the substrate treatment is poor, and the treating quality between each substrate is relatively uneven compared to the batch-type treating method.

In addition, if the substrate is spin-dried by a rotation, if the pattern formed on the substrate has the high aspect ratio, there is a concern that a leaning phenomenon, in which the pattern formed on the substrate collapses, may occur.

SUMMARY

Embodiments of the inventive concept provide a substrate treating apparatus and method for efficiently treating a substrate.

Embodiments of the inventive concept provide a substrate treating apparatus and method for improving a mass productivity of a substrate treating.

Embodiments of the inventive concept provide a substrate treating apparatus and method for improving a uniformity of a treatment quality between each substrate.

Embodiments of the inventive concept provide a substrate treating apparatus and method for minimizing a risk of generating a water mark on a substrate.

Embodiments of the inventive concept provide a substrate treating apparatus and method for minimizing a generation of a leaning phenomenon of a pattern formed on a substrate.

Embodiments of the inventive concept provide a substrate treating apparatus and method for efficiently treating a substrate at which a pattern with a high aspect ratio is formed.

The technical objectives of the inventive concept are not limited to the above-mentioned ones, and the other unmentioned technical objects will become apparent to those skilled in the art from the following description.

The inventive concept provides a substrate treating apparatus. The substrate treating apparatus includes a treating bath having an accommodation space for accommodating a treating liquid; a support member configured to support at least one substrate in a vertical posture at the accommodation space; and a posture changing robot configured to change a posture of the substrate immersed in the treating liquid from the vertical posture to a horizontal posture, and wherein the posture changing robot comprises: a body configured to hold the substrate thereon; and a liquid supply member configured to supply a wetting liquid to the substrate placed on the body.

In an embodiment, the liquid supply member comprises: at least one first nozzle, each first nozzle supplying the wetting liquid to a first region of the substrate placed on the body; and at least one second nozzle, each second nozzle supplying the wetting liquid to a second region, which is a region different from the first region, of the substrate placed on the body.

In an embodiment, a spray distance of the wetting liquid supplied from the first nozzle is different from a spray distance of the wetting liquid supplied from the second nozzle.

In an embodiment, a distance between the first region and the first nozzle is shorter than a distance between the second region and the second nozzle, the first region and the second region are an edge region of the substrate, and the spray distance of the wetting liquid supplied from the first nozzle is shorter than the spray distance of the wetting liquid supplied from the second nozzle.

In an embodiment, a diameter of a spray hole of the first nozzle is larger than a diameter of a spray hole of the second nozzle.

In an embodiment, a supply flow rate of the wetting liquid transferred to the first nozzle per unit time is the same as a supply flow rate of the wetting liquid transferred to the second nozzle per unit time.

In an embodiment, the body comprises: a support body on which the substrate is placed; and a chucking body configured to chuck the substrate placed on the support body.

In an embodiment, the liquid supply member is installed on the support body.

In an embodiment, the posture changing robot comprises: a joint portion; and a hand coupled to the joint portion and including the support body and the chucking body, and wherein the hand further comprises a fastening body configured to couple the chucking body and the support body to the joint portion.

In an embodiment, the liquid supply member is installed on the fastening body.

In an embodiment, the liquid supply member is a supply pipe at which the first nozzle and the second nozzle are formed.

In an embodiment, the liquid supply member is fastened to the joint portion and configured to supply the wetting liquid to a center region of the substrate placed on the support body.

The inventive concept provides a substrate treating apparatus. The substrate treating apparatus includes a first process treating unit configured to treat a substrate in a batch-type manner; and a second process treating unit configured to treat the substrate in a single-type manner, and wherein the first process treating unit comprises: a posture changing treating bath configured to have an accommodation space for accommodating a liquid; a support member configured to support at least one substrate in a vertical posture at the accommodation space; and a posture changing robot configured to change a posture of a substrate immersed in the liquid from the vertical posture to a horizontal posture, the posture changing robot having a body for holding the substrate, an arm for changing a position of the body, and a liquid supply member for supplying a wetting liquid to the substrate placed on the body.

In an embodiment, the liquid supply member comprises: at least one first nozzle for supplying the wetting liquid to a first region of the substrate placed on the body; and at least one second nozzle for supplying the wetting liquid to a second region, which is a different region from the first region, of the substrate placed on the support body.

In an embodiment, a spray distance of the wetting liquid supplied from the first nozzle is different from a spray distance of the wetting liquid supplied from the second nozzle.

In an embodiment, a distance between the first region and the first nozzle is shorter than a distance between the second region and the second nozzle, and the first region and the second region are an edge region of the substrate, and a spray distance of the wetting liquid supplied from the first nozzle is shorter than a spray distance of the wetting liquid supplied from the second nozzle.

In an embodiment, a diameter of a spray hole of the first nozzle is smaller than a diameter of a spray hole of the second nozzle.

In an embodiment, a supply flow rate of the wetting liquid transferred to the first nozzle per unit time is the same as a supply flow rate of the wetting liquid transferred to the second nozzle per unit time.

The inventive concept provides a substrate treating apparatus. The substrate treating apparatus includes a first process treating unit configured to treat a substrate in a batch-type manner; a second process treating unit configured to treat the substrate in a single-type manner; and a controller, wherein the first process treating unit comprises: a batch-type treating bath configured to treat the substrates in a vertical posture; a posture changing treating bath configured to change a posture of the substrate in the vertical posture to a horizontal posture, the posture changing treating bath having an accommodation space for accommodating a liquid and a support member for supporting the substrate at the accommodation space in the vertical posture; and a posture changing robot configured to change the posture of the substrate immersed in the liquid from the vertical posture to the horizontal posture, the posture changing robot having a body for holding the substrate, an arm for changing a position of the body, and a liquid supply member for supplying a wetting liquid to the substrate placed on the body, and wherein the second process treating unit comprises: a single-type treating chamber configured to treat the substrate in the horizontal posture; a buffer unit configured to provide a space for temporarily storing the substrate; and a transfer robot configured to transfer the substrate between the buffer unit and the single-type treating chamber, and wherein the controller controls the posture changing robot so the posture changing robot may complete a posture changing of the substrate and transfer a substrate which posture has been changed to the buffer unit.

In an embodiment, the controller controls the posture changing robot so the posture changing of the substrate is complete, the substrate is moved so the substrate deviates from the liquid stored at the posture changing treating bath, and the wetting liquid is supplied to the substrate by the liquid supply member if the substrate deviates from the liquid.

According to an embodiment of the inventive concept, a substrate may be efficiently treated.

According to an embodiment of the inventive concept, a mass productivity of a substrate treating may be improved.

According to an embodiment of the inventive concept, a uniformity of a treatment quality between each substrate may be improved.

According to an embodiment of the inventive concept, a risk of generating a water mark on a substrate may be minimized.

According to an embodiment of the inventive concept, a leaning phenomenon of a pattern formed on a substrate may be minimized.

According to an embodiment of the inventive concept, a substrate at which a pattern with a high aspect ratio is formed may be efficiently treated.

The effects of the inventive concept are not limited to the above-mentioned ones, and the other unmentioned effects will become apparent to those skilled in the art from the following description.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
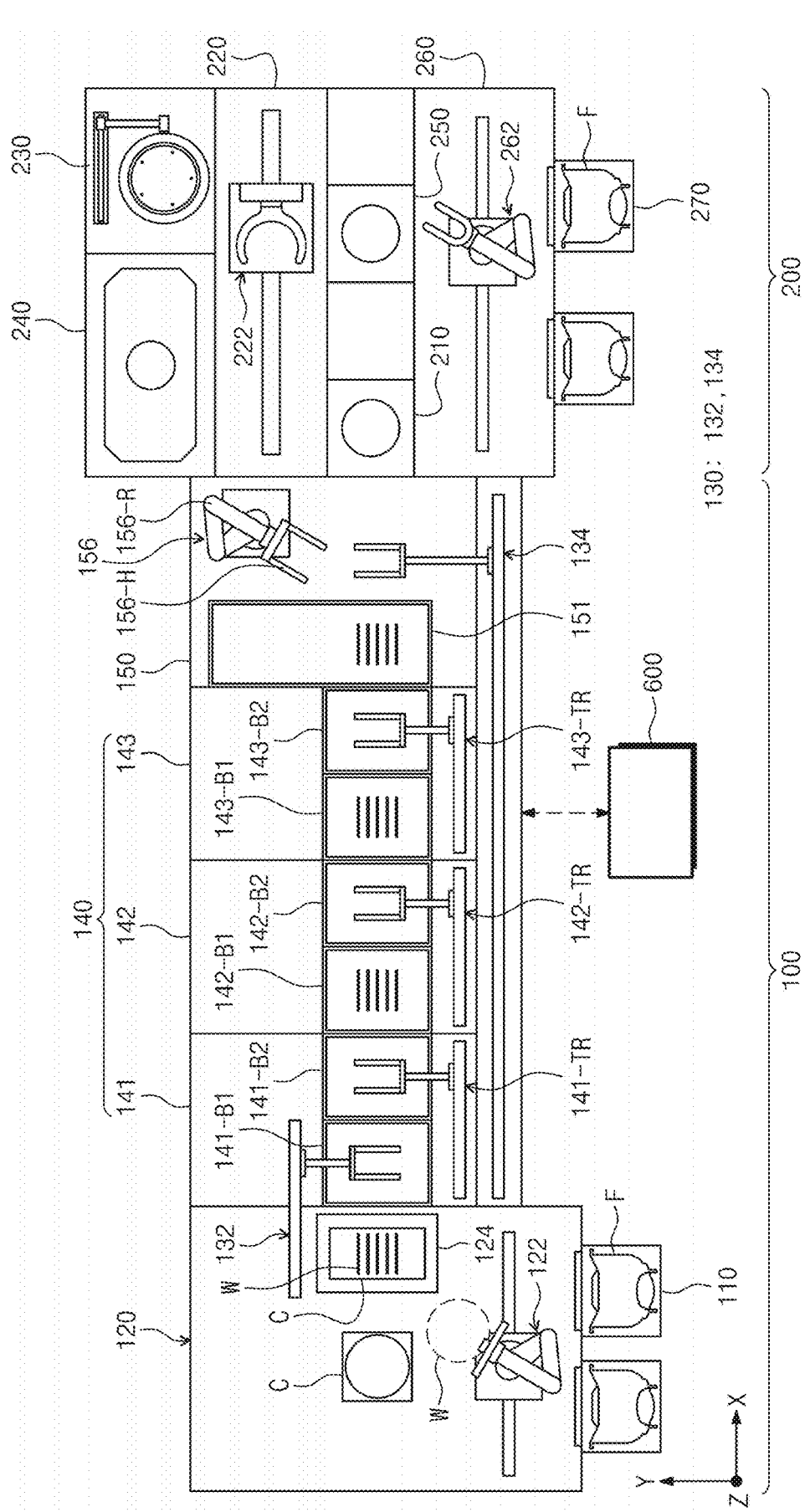
FIG. 1 is a schematic top view of a substrate treating apparatus according to an embodiment of the inventive concept.

The inventive concept may be variously modified and may have various forms, and specific embodiments thereof will be illustrated in the drawings and described in detail. However, the embodiments according to the concept of the inventive concept are not intended to limit the specific disclosed forms, and it should be understood that the present inventive concept includes all transforms, equivalents, and replacements included in the spirit and technical scope of the inventive concept. In a description of the inventive concept, a detailed description of related known technologies may be omitted when it may make the essence of the inventive concept unclear.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises", "comprising,", "includes", and/or "including" when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "example" is intended to refer to an example or illustration.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

It should be understood that when an element or layer is referred to as being "on," "connected to," "coupled to," or "covering" another element or layer, it may be directly on, connected to, coupled to, or covering the other element or layer or intervening elements or layers may be present. In contrast, when an element is referred to as being "directly on," "directly connected to," or "directly coupled to" another element or layer, there are no intervening elements or layers present. Other terms such as "between", "adjacent", "near" or the like should be interpreted in the same way.

Unless otherwise defined, all terms used herein, including technical or scientific terms, have the same meaning as those generally understood by those skilled in the art to which the inventive concept belongs. Terms such as those defined in commonly used dictionaries should be interpreted as consistent with the context of the relevant technology and not as ideal or excessively formal unless clearly defined in this application.

In addition, components that transfer the substrate W described below, for example, the following transfer unit or transfer robots, may be referred to as a transfer module.

Hereinafter, an embodiment of the inventive concept will be described with reference to FIG. 1 to FIG. 19.

FIG. 1 is a schematic top view of a substrate treating apparatus according to an embodiment of the inventive concept.

Referring to FIG. 1, a substrate treating apparatus 10 according to an embodiment of the inventive concept may include a first process treating unit 100, a second process treating unit 200, and a controller 600. The first process treating unit 100 and the second treating unit 200 may be arranged along a first direction X when viewed from above. Hereinafter, when viewed from above, a direction perpendicular to the first direction X is referred to as a second direction Y, and a direction perpendicular to the first direction X and the second direction Y is referred to as a third direction Z.

The first process treating unit 100 may collectively liquid treat a plurality of substrates W in a batch-type manner. For example, the first process treating unit 100 may collectively clean the plurality of substrates W in the batch-type manner. In the first process treating unit 100, the plurality of substrates W in a vertical posture (a posture at which a top surface or a bottom surface of the substrate W is parallel to a direction perpendicular to the ground) may be simultaneously treated.

The first process treating unit 100 may include a first load port unit 110, an index chamber 120, a transfer unit 130, a batch-type treating unit 140, and a posture changing unit 150.

The first load port unit 110 may include at least one load port. A transfer container F in which at least one substrate W is stored may be placed on the load ports of the first load port unit 110. The plurality of substrates W may be stored at the transfer container F. For example, 25 substrates may be stored at the transfer container F. The transfer container F may be referred to as a cassette, a pod, a FOUP, or the like. The transfer container F may be loaded on the first load port unit 110 by a container transfer apparatus. The substrates W stored at the transfer container F placed in the first load port unit 110 may be untreated substrates W. An untreated substrate W may be, for example, a substrate W on which a treatment has not been carried out, or substrates W on which some treatment has been carried out but a liquid treatment is required.

In addition, only a container F in which the untreated substrate W is stored may be placed in the first load port unit 110. That is, the first load port unit 110 may perform only a role of which a substrate W requiring a treatment is loaded.

The first load port unit 110 may be coupled to the index chamber 120. The index chamber 120 and the first load port unit 110 may be arranged along the second direction Y. The first index chamber 120 may include an index robot 122 and a posture changing unit 124. The index robot 122 may take out the untreated substrate W or the substrate requiring a treatment from a container F mounted on the first load port unit 110. A first transfer robot 122 may take the substrate W out of the container F and carry the substrate W into a storage container C provided in the first index chamber 120. The first transfer robot 122 may have a batch-type hand capable of simultaneously holding and transferring a plurality of substrates W (e.g., 25 sheets).

The storage container C may have a substantially cylindrical shape. The storage container C may have a storage space therein. A plurality of substrates W may be stored in the storage space of the storage container C. For example, 50 substrates W may be stored in the storage space of the storage container C. The storage container C may have a cylindrical shape in which at least two or more surfaces of the storage container C are open. A support member for supporting/holding the substrate W may be provided in the storage space of the storage container C.

If the substrate W taken out from the transfer container F is completely taken into the storage container C, the storage container C may be returned to the posture changing unit 124 disposed in the index chamber 120 by a transfer means which is not shown. The posture changing unit 124 may rotate the storage container C. For example, the posture changing unit 124 may rotate the storage container C so that an open portion of the storage container C faces upward. If the open portion of the storage container C is rotated to face upward, a posture of a substrate W stored in the storage container C may be changed from a horizontal posture (the top surface and the bottom surface of the substrate W are horizontal to the ground) to a vertical posture. The horizontal posture may mean a state in which the top surface of the substrate W (e.g., a surface on which a pattern is formed) is parallel to an X-Y plane (i.e., the ground), and the vertical posture may mean a state in which the top surface of the substrate W is parallel to an X-Z plane or a Y-Z plane (i.e., a surface perpendicular to the ground).

The transfer unit 130 may include a first transfer unit 132 for transferring the substrate W between the index chamber 120 and the batch-type treating unit 140, and a second transfer unit 134 for transferring the substrate W between the batch-type treating unit 140 and the posture changing unit 150 to be described later.

The first transfer unit 132 may include a rail extending along the first direction X, and a hand configured to transfer a plurality of substrates W at once. The first transfer unit 132 may hold the substrates W which postures are changed at the posture changing unit 124 and return the held substrates W to the batch-type treating unit 140. For example, the first transfer unit 132 may transfer the substrates W which postures are changed at the posture changing unit 124 to any selected one of the treating baths among the batch-type treating baths 141-B1 to 143-B2 included in the batch-type treating unit 140. For example, the first transfer unit 132 may transfer substrates W which posture is changed at the posture changing unit 124 to a 1-1 batch-type treating bath 141-B1.

The second transfer unit 134 may include a rail extending along the first direction X, and a hand configured to transfer a plurality of substrates W at once. The second transfer unit 134 may be configured to transfer the substrate W between a first batch-type treating unit 141, a second batch-type treating unit 142, and a third batch-type treating unit 143 included in the batch-type treating unit 140. In addition, the second transfer unit 134 may be configured to transfer the substrate W between the batch-type treating unit 14 and the posture changing unit 150.

In addition, substrates in which a posture is changed by the posture changing unit 124 and which are stored at the storage container C and substrates W stored in the batch-type treating bath of the batch-type treating unit 140 may be arranged in parallel in the first direction X when viewed from above.

In addition, substrates W stored in the batch-type treating baths 141-B1 to 143-B2 of the batch-type treating unit 140 and substrates W stored in the posture changing treating bath 151 of the posture changing unit 150 may be arranged in parallel along the first direction X when viewed from above. In addition, the substrates W stored in the batch-type treating baths 141-B1 to 143-B2 of the batch-type treating unit 140 may be arranged in parallel in the first direction X when viewed from above. That is, the support member 141-B1-6 of each of the batch-type treating baths 141-B1 to 143-B2 and the support member 153 of the posture changing treating bath 151 may be arranged in parallel in the first direction X when viewed from above.

The batch-type treating unit 140 may liquid treat a plurality of substrates W at once. The batch-type treating unit 140 may clean the plurality of substrates W at once using a treating liquid. The batch-type treating unit 140 may liquid-treat the plurality of substrates W at once using the treating liquid. The treating liquid used in the batch-type treating unit 140 may be a chemical and/or a rinsing liquid. For example, the chemical may be a chemical having the property of a strong acid or a strong base. Also, the rinsing liquid may be a pure water. For example, the chemical may be appropriately chosen from an ammonia-hydrogen peroxide mixture (APM), a hydrochloricacid-hydrogen peroxide mixture (HPM), a hydrofluoricacid-hydrogen peroxide mixture (FPM), a diluted hydrofluoric acid (DHF), a diluted sulfuric acid peroxide (DSP), a chemical which removes a SiN, a chemical including a phosphoric acid, and a chemical including a sulfuric acid, etc. The rinsing liquid may be a liquid containing water. For example, the rinsing liquid may be appropriately chosen from a pure water or an ozone water.

The batch-type treating unit 140 may include a first batch-type treating unit 141, a second batch-type treating unit 142, and a third batch-type treating unit 143.

The first batch-type treating unit 141 may include a 1-1 batch-type treating bath 141-B1, a 1-2 batch-type treating bath 141-B2, and a first batch-type transfer unit 141-TR.

In the 1-1 batch-type treating bath 141-B1, a plurality of substrates W may be simultaneously liquid-treated with a chemical such as a DSP. In the 1-2 batch-type treating bath 141-B2, the plurality of substrates W may be simultaneously treated with a chemical such as a DHF. However, the inventive concept is not limited thereto, and a treating liquid used in the 1-1 batch-type treating bath 141-B1 and the 1-2 batch-type treating bath 141-B2 may be variously modified to a treating liquid selected from the above-described treating liquids.

The first batch-type transfer unit 141-TR may be configured to transfer the substrate W between the 1-1 batch-type treating bath 141-B1 and the 1-2 batch-type treating bath 141-B2.

The second batch-type treating unit 142 may include a 2-1 batch-type treating bath 1442-B1, a 2-2 batch-type treating bath 1442-B2, and a second batch-type transfer unit 142-TR.

In the 2-1 batch-type treating bath 144-B1, the plurality of substrates W may be simultaneously liquid-treated with a chemical containing a phosphoric acid. In the 2-2 batch-type treating bath 142-B2, the plurality of substrates W may be simultaneously treated with a rinsing liquid. However, the inventive concept is not limited thereto, and the treating liquid used in the 2-1 batch-type treating bath 142-B1 and the 2-2 batch-type treating bath 142-B2 may be variously modified to a treating liquid selected from the above-described treating liquids.

The second batch-type transfer unit 142-TR may be configured to transport the substrate W between the 2-1 batch-type treating bath 141-B1 and the 2-2 batch-type treating bath 1442-B2.

The third batch-type treating unit 143 may include a 3-1 batch-type treating bath 142-B1, a 3-2 batch-type treating bath 143-B2, and a third batch-type transfer unit 143-TR.

In the 3-1 batch-type treating bath 143-B1, the plurality of substrates W may be simultaneously liquid-treated with a chemical containing the phosphoric acid. In the 3-2 batch-type treating bath 143-B2, the plurality of substrates W may be simultaneously treated with a rinsing liquid. However, the inventive concept is not limited thereto, and the treating liquid used in the 3-1 batch-type treating bath 143-B1 and the 3-2 batch-type treating bath 143-B2 may be variously modified to a treating liquid selected from the above-described treating liquids.

The third batch-type transfer unit 143-TR may be configured to transfer the substrate W between the 3-1 batch-type treating bath 143-B1 and the 3-2 batch-type treating bath 143-B2.

Since the batch-type treating baths 141-B1 to 143-B2 have the same or similar structure except for a type of treating liquid L used, the 1-1 batch-type treating bath 141-B1 will be described hereinafter, and a repeated description of the remaining batch-type treating baths 141-B2 to 143-B2 will be omitted.

Figure 2:
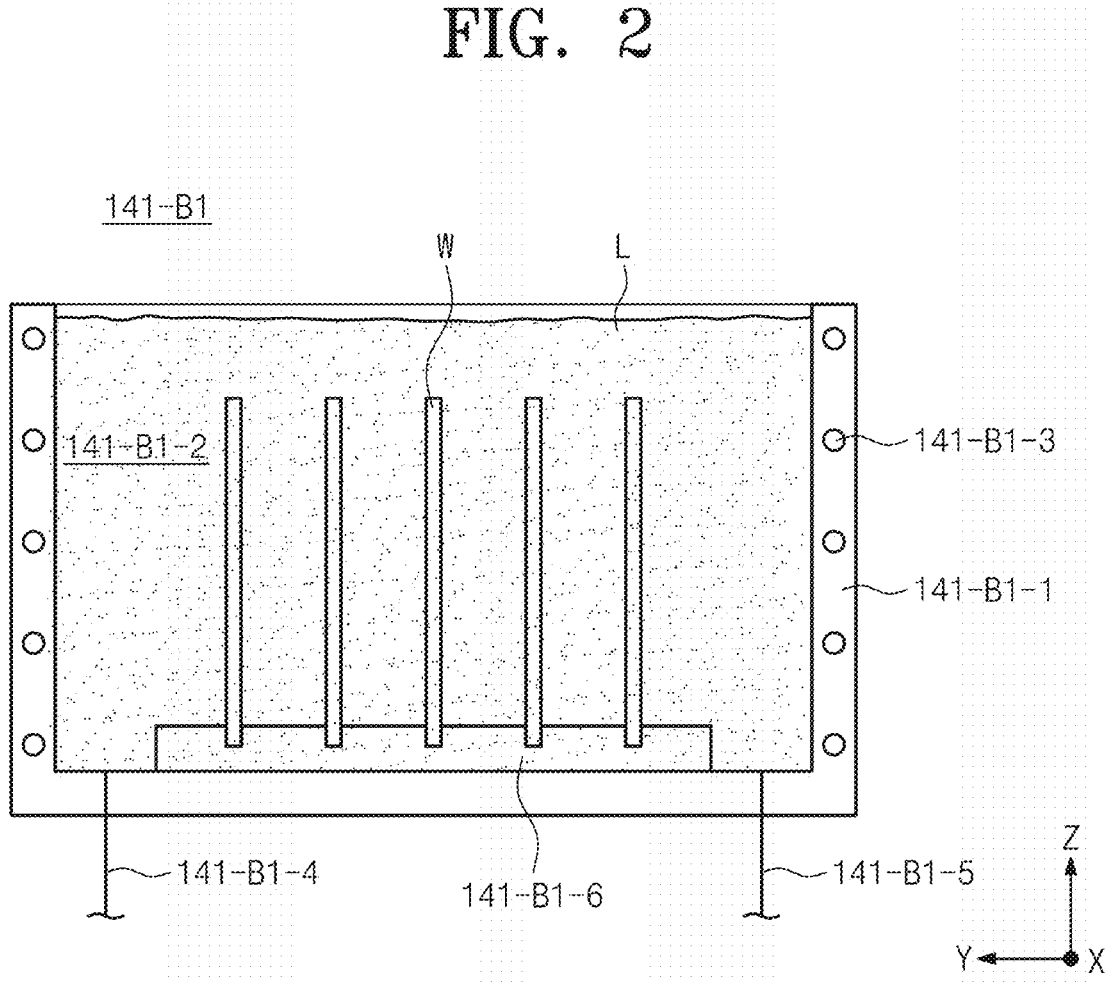
FIG. 2 illustrates any one batch-type treating bath among batch-type treating baths of FIG. 1.

FIG. 2 illustrates a batch-type treating bath of any one of the batch-type treating baths of FIG. 1. For example, FIG. 2 illustrates a 1-1 batch-type treating bath 141-B1 among batch-type treating baths 141-B1 to 143-B2.

Referring to FIG. 2, the 1-1 batch-type treating bath 141-B1 may include a treating bath 141-B1-1, a heating member 141-B1-3, a supply line 141-B1-4), a recollecting line 141-B1-5, and a support member 141-B1-6.

The treating bath 141-B1-1 may have an accommodation space 1441-B1-2 therein. The treating bath 141-B1-1 may have a cylindrical shape with an open top. The treating liquid L may be stored in the accommodation space 1441-B1-2 of the treating bath 141-B1-1. In order to adjust a temperature of the treating liquid L stored in the accommodation space 141-B1-2, the heating member 141-B1-3 may be installed at the treating bath 141-B1-1. The heating member 141-B1-3 may heat the temperature of the treating liquid L stored in the accommodation space 1441-B1-2 of the treating bath 141-B1-1 to a set temperature based on a temperature of the treating liquid L sensed by a temperature sensor which is not shown.

The supply line 141-B1-4 may supply the treating liquid L to the accommodation space 1441-B1-2. The recollecting line 141-B1-5 may drain the treating liquid L in the accommodation space 1441-B1-2. A valve is installed at each of the supply line 144-B1-4 and the recollecting line 141-B1-5, and based on a liquid level of the treating liquid L sensed by the liquid level sensor which is not shown, a liquid level (an amount of the treating liquid L stored in the accommodation space 144-B1-2) of the treating liquid L supplied to the accommodation space 141-B1-2 may be adjusted to a set level.

The support member 141-B1-6 may be disposed in the accommodation space 141-B1-2 to support the substrate W. The support members 141-B1-6 may be configured to support the plurality of substrates W. For example, the support member 141-B1-6 may be configured to support 50 substrates W. The support member 141-B1-6 may be configured such that a pair of rod-shaped bodies are disposed to face each other, and a support groove (not shown) through which the substrate W may be supported is formed in each body.

Referring back to FIG. 1, the posture changing unit 150 may change the posture of the substrate W. The posture changing unit 150 may change the substrate W from the vertical posture to the horizontal posture. The posture changing unit 150 may change the posture of the substrate W treated in the batch-type treating unit 140 so that the substrate W treated in the vertical posture may be post-treated in the single-type treating chambers 230 and 240, which processes the substrate W with respect to a single substrate W, in the horizontal posture. The posture changing unit 150 may be disposed between the batch-type treating unit 140 and the second process treating unit 200.

The posture changing unit 150 may include a posture changing treating bath 151 and a posture changing robot 156. When viewed from above, the posture changing treating bath 151 may have a larger width than the batch-type treating baths 141-B1 to 143-B2. For example, when viewed from above, the posture changing treating bath 151 may have a greater width in the second direction (Y, a direction) than the batch-type treating baths 141-B1 to 143-B2. Also, when viewed from above, the posture changing treating bath 151 may have the same width as the batch-type treating baths 141-B1 to 143-B2 in the first direction (X, another direction).

Figure 3:
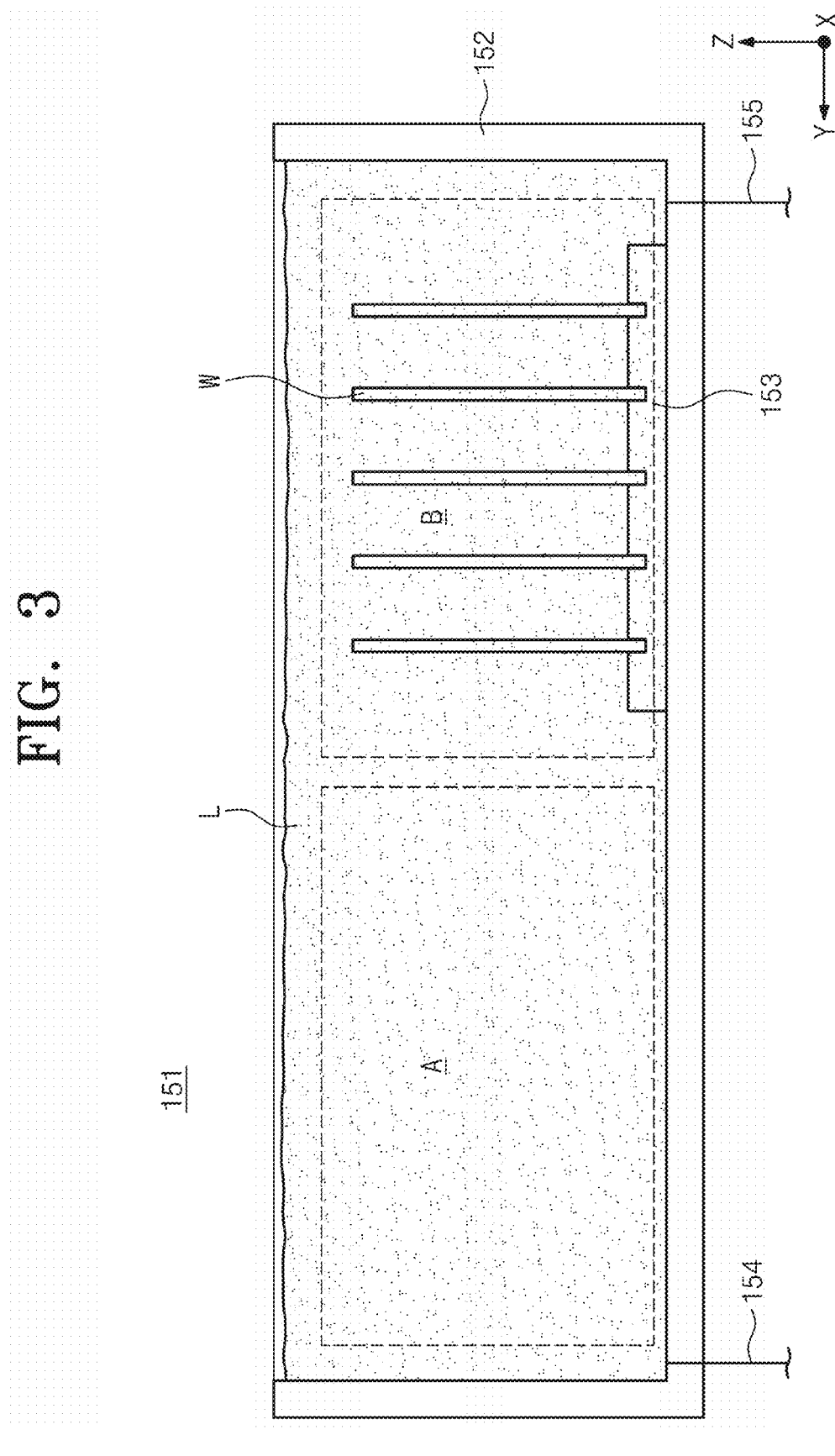
FIG. 3 illustrates a state of a posture changing treating bath of FIG. 1.

FIG. 3 illustrates the posture changing treating bath of FIG. 1.

Referring to FIG. 3, the posture changing treating bath 151 may include a treating bath 152, a support member 153, a supply line 154, and a recollecting line 155.

The treating bath 152 may have a cylindrical shape with an open top. The treating bath 152 may have a rectangular cylindrical shape with an open top. The treating bath 152 may have accommodation spaces A and B in which the treating liquid L may be stored. The treating liquid L stored in the treating bath 152 may be a liquid containing water. A type of the treating liquid L stored in the treating bath 152 may be the same type of liquid as a wetting liquid sprayed by a first buffer unit 210 to be described later. For example, both the treating liquid L stored in the treating bath 152 and the wetting liquid sprayed from the first buffer unit 210 may be liquid containing water.

The support member 153 may be disposed in the accommodation spaces A and B to support the substrate W. The support members A and B may be configured to support a plurality of substrates W. For example, the support member 153 may be configured to support 50 substrates W. A pair of rod-shaped bodies are disposed to face each other, and a support groove (not shown) through which the substrate W can be supported can be formed at each body.

The supply line 154 may supply the treating liquid L to the accommodation spaces A and B. The recollecting line 155 may drain the treating liquid L in the accommodation spaces A and B. A valve is installed in each of the supply line 154 and the recollecting line 155, and based on the liquid level of the treating liquid L sensed by the liquid level sensor, a liquid level of the treating liquid L supplied to the accommodation spaces A and B (an amount of treating liquid L stored at the accommodation spaces A and B) may be adjusted to a set level.

In addition, the accommodation spaces A and B may include a support region A and a posture changing region B. The support region A may be a region in which the support member 153 supports the substrate W. The posture changing region B may be a region in which the posture of the substrate W is changed by the posture changing robot 156 to be described later.

Referring back to FIG. 1, the posture changing robot 156 may be disposed on a side of the posture changing treating bath 151. The posture changing robot 156 may be disposed between the posture changing treating bath 151 and a first buffer unit 210 to be described later. The posture changing robot 156 may include a hand 156-H and a joint portion 156-R. The hand 156-H may be coupled to the joint portion 156-R. The joint portion 156-R may change a position of the hand 156-H.

Figure 4:
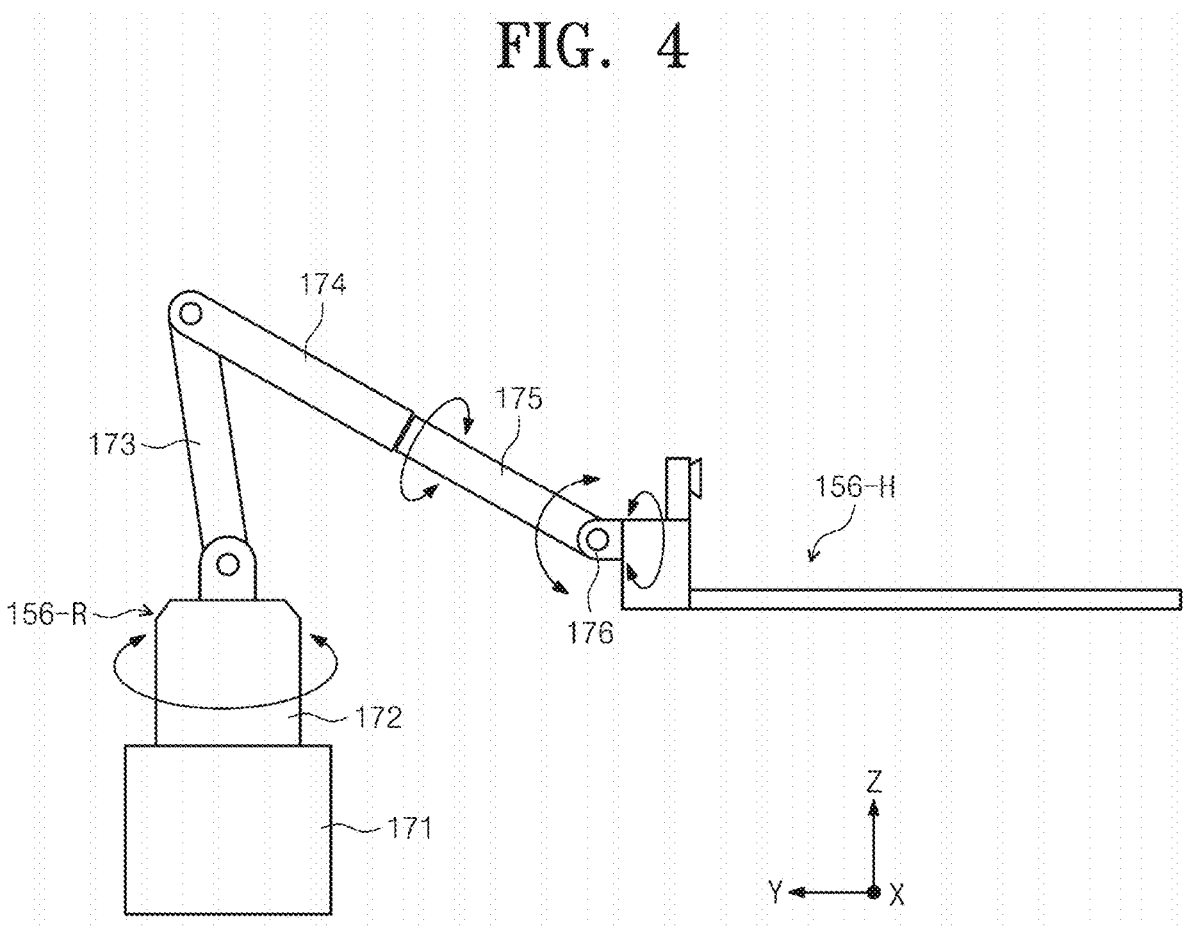
FIG. 4 schematically illustrates a posture changing robot of FIG. 1.

FIG. 4 schematically illustrates the posture changing robot of FIG. 1. Referring to FIG. 4, the posture changing robot 156 according to an embodiment of the inventive concept, the posture changing robot 156 may change the posture of the substrate W from the vertical posture to the horizontal posture in the posture changing treating bath 151, and transfer a substrate changed to the horizontal posture to the first buffer unit 210 of the second process treating unit 200. Also, the posture changing robot 156 may be a multi-joint robot. The posture changing robot 156 may be a six-axis multi-joint robot.

The joint portion 156-R may be a multi-joint arm composed of at least two axes. For example, the joint portion 156-R may be a six-axis multi-joint arm. The joint portion 156-R may change the position of the hand 156-H by moving the hand 156-H in at least one of the first direction X, the second direction Y, and the third direction Z. In addition, the joint portion 156-R may rotate the hand 156-H based on an axis of one of the first direction X, the second direction Y, and the third direction Z.

The posture changing robot 156 may include a base 171, a rotation body 172, a first arm 173, a second arm 174, a third arm 175, and a fourth arm 176.

The base 171 may be coupled to the rotation body 172. The rotation body 172 may rotate based on the base 171. The rotation body 172 may be rotated with a direction perpendicular to the ground as a rotation axis. The first arm 173 may be coupled to the rotation body 172. The first arm 173 may be rotated with respect to the rotation body with a rotation axis in the horizontal direction. The second arm 174 may be coupled to the first arm 173. The second arm 174 may be rotated with respect to the first arm 173 with the rotation axis in the horizontal direction. The third arm 175 may be coupled to the second arm 174. The third arm 175 may be rotated in a lengthwise direction (or a lengthwise direction of the third arm 175) of the second arm 174. The fourth arm 176 may be rotated in a direction perpendicular to a lengthwise direction of the third arm 175 as a rotation axis. Also, the fourth arm 176 may rotate the hand 156-H. For example, the fourth arm 176 may have a rotation shaft (not shown) capable of rotating the hand 156-H. The hand 156-H may be rotated with a direction perpendicular to a rotation axis of the fourth arm 176 as a rotation axis.

Figure 5:
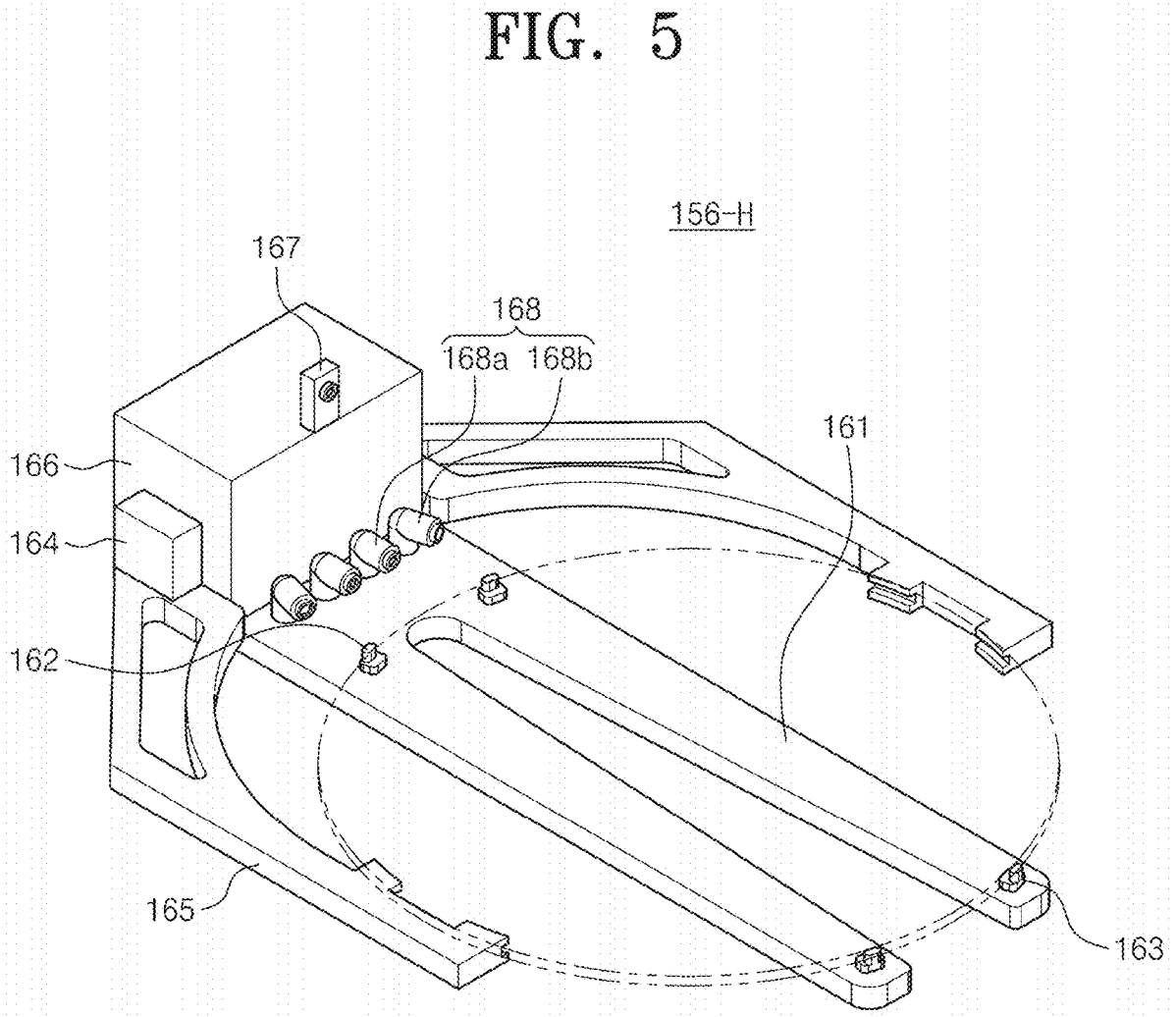
FIG. 5 illustrates a hand of FIG. 4.

FIG. 5 illustrates the hand of FIG. 4. Referring to FIG. 5, the hand 156-H of the posture changing robot 156 may include a support body 161, a first guide portion 162, a second guide portion 163, a driving member 164, a chucking body 165, a fastening body 166, a vision member 167, and a liquid supply member 168.

The support body 161 may support a bottom surface of the substrate W. The support body 161 may support a top surface on which a pattern of the substrate W is formed, and a bottom surface of the substrate W among bottom surfaces on which the pattern is not formed. That is, the substrate W may be placed on the support body 161.

The first guide portion 162 and the second guide portion 163 may be provided on the support body 161. The first guide portion 162 may be a support pad close to the fastening body 166 to be described later. The second guide portion 163 may be a support pad far from the fastening body 166 to be described later. Each of the first guide portion 162 and the second guide portion 163 may be provided in a pair. The first guide portion 162 and the second guide portion 163 may support a bottom surface and/or a side surface of the substrate W. The first guide portion 162 and the second guide portion 163 may have a stepped top surface. For example, a height of the inner region supporting the bottom surface of the substrate W among the top surface of the first guide portion 162 may be lower than a height of the outer region not supporting the bottom surface of the substrate W. Similarly, a height of an inner region of the top surface of the second guide portion 163 that supports the bottom surface of the substrate W may be lower than a height of an outer region that does not support the bottom surface of the substrate W. That is, the substrate W may be placed on the support body 161 via the first guide portion 162 and the second guide portion 163 installed on the support body 161. The substrate W being placed on the support body 161 should be interpreted as including not only when the support body 161 and the substrate W directly contact each other, but also when the substrate W is placed on the first guide portion 162 and the second guide portion 163 installed on the support body 161.

The driving member 164 may be fastened to the fastening body 166. The driving member 164 may be a driver capable of moving the chucking body 165 in a lateral direction. The driving member 164 may be provided in a pair. For example, the driving member 164 may be provided to correspond to each of the chucking bodies 165 provided in a pair. A pair of driving members 164 may move a pair of chucking bodies 165 in the lateral direction. The chucking bodies 165 may be moved in a direction close to a side of the substrate W and in a direction away from the side of the substrate W. Accordingly, the chucking body 165 may chuck the substrate W placed on the support body 161. In other words, the support body 161 and the chucking body 165 may be bodies that hold the substrate W.

The fastening body 166 may be a body that couples the chucking body 165 and the support body 161 to the joint portion 156-R. The fastening body 166 may be a body that couples the chucking body 165 and the support body 161 to the fourth arm 176 of the joint portion 156-R. The fastening body 166 may be fastened to a rotation shaft of the fourth arm 176 of the joint portion 156-R.

Each of the support bodies 161 may be provided with a first guide portion 162 and a second guide portion 163. The first guide portion 162 may be a protrusion close to a rotation member 166 to be described later. The second guide portion 163 may be a protrusion relatively far from the rotation member 166 to be described later. The second guide portion 163 may be disposed farther from the rotation member 166 than the first guide portion 162. The first guide portion 162 and the second guide portion 163 may support a side portion of the substrate W. The first guide portion 162 and the second guide portion 1263 support the side portion of the substrate W, and a space between the two may be slightly smaller than a diameter of the substrate W.

The vision member 167 may acquire an image by imaging the substrate W and/or the support body 161. An acquired image may be transmitted to the controller 600 to be described later. The controller 600 may generate a control signal for controlling a driving of the posture changing robot 156 based on the image acquired by the vision member 167.

The liquid supply member 168 may supply the wetting liquid WL to the substrate W placed on the support body 161. The wetting liquid WL may include water. The wetting liquid WL supplied by the liquid supply member 168 may be the same type of liquid as the treating liquid L stored in the accommodation spaces A and B. In addition, the wetting liquid WL supplied by the liquid supply member 168 may be the same type of liquid as the wetting liquid WL supplied by the first buffer unit 210 to be described later.

The liquid supply member 168 may include a first nozzle 166a and a second nozzle 166b. At least one of the first nozzle 166a and at least one of the second nozzle 166b may be provided. A plurality of first nozzles 168a and second nozzles 166b may be provided, respectively. The first nozzle 166a may supply the wetting liquid WL to a first region of the substrate W placed on the support body 161. The second nozzle 166b may supply the wetting liquid WL to the second region of the substrate W placed on the support body 161. The first region and the second region may be different regions. The first region and the second region may be an edge region of the substrate W as described below. The first region may be adjacent to the first nozzle 166a, and the second region may be adjacent to the second nozzle 166b.

A distance between the first region and the first nozzle 166a may be shorter than a distance between the second region and the second nozzle 166b. That is, a spray distance of the wetting liquid WL supplied from the first nozzle 166a may be different from a spray distance of the wetting liquid WL supplied from the second nozzle 168b. For example, the spray distance of the wetting liquid WL supplied from the first nozzle 168a may be shorter than the spray distance of the wetting liquid WL supplied from the second nozzle 168b.

Also, when viewed from above, the first nozzles 168a may be disposed between the second nozzles 168b. The second nozzles 168b may be disposed at a position relatively close to the chucking body 165, that is, at an outer side. The first nozzles 166a may be disposed at a position relatively far from the chucking body 165, that is, an inner side.

A wetting liquid WL spray direction of the first nozzle 168a and the second nozzle 168b may be different from each other. For example, when viewed from above, the first nozzle 166a may supply the wetting liquid WL in a direction parallel to a reference line, and the second nozzle 168b may supply the wetting liquid WL in a direction inclined to the reference line, the reference line being an imaginary reference line passing through a center of the substrate W and a center of the vision member 167.

A diameter of a spray hole of the first nozzle 168a and the second nozzle 168b may be different from each other. For example, the diameter of the spray hole of the first nozzle 166a may be larger than the diameter of the spray hole of the second nozzle 166a. For example, a supply flow rate of the wetting liquid WL transferred to the first nozzle 168a and the second nozzle 168b may be the same per unit time. Therefore, a spray distance of the wetting liquid WL sprayed from the first nozzle 166a may be shorter than a spray distance of the wetting liquid WL sprayed from the second nozzle 168b.

Also, the first nozzle 166a and the second body 166b may be installed on the support body 161.

Referring back to FIG. 1, the second process treating unit 200 may treat a substrate W treated by the first process treating unit 100. The second process treating unit 200 may treat the substrate W treated by the first treating unit 100, and may liquid-treat or dry the substrate W in a single-type manner.

The second process treating unit 200 may include a first buffer unit 210, a first transfer chamber 220, a single-type liquid treating chamber 230, a drying chamber 240, a second buffer unit 250, a second transfer chamber 260, and a second load port unit 270. Both the single-type liquid treating chamber 230 and the drying chamber 240 may be referred to as single-type treating chambers.

The first buffer unit 210 may provide a storage space for temporarily storing the substrate W. When viewed from above, the first buffer unit 210 may be open toward the posture changing unit 150. When viewed from above, the first buffer unit 210 may be opened toward the first transfer chamber 220. Accordingly, the posture changing robot 156 may change the posture of the substrate W in the posture changing treating bath 151 and return a substrate W having a changed posture to the first buffer unit 210. In addition, a substrate W transferred to the first buffer unit 210 may be taken out by the first transfer robot 222 of the first transfer chamber 220. A substrate which is taken out may be transferred to the single-type liquid treating chamber 230 or the single-type drying chamber 240.

Also, the first buffer unit 210 may be disposed at a relatively higher height than the above-described posture changing treating bath 151. For example, if the posture changing treating bath 151 is disposed on a first layer, the first buffer unit 210 may be disposed at a height of about two layers or about 1.5 layers.

If necessary, the first buffer unit 210 may be disposed to be stacked with at least a portion of the single-type treating chambers. For example, a drying chamber 240 or a single-type liquid treating chamber 230 to be described later may be disposed under the first buffer unit 210. For example, a single-type liquid treating chamber 230 to be described later may be disposed under the first buffer unit 210. One or a plurality of single-type liquid treating chambers 230 disposed under the first buffer unit 210. That is, the first buffer unit 210 is provided to be stacked with a single-type treating chamber so as to directly store a substrate W transferred by the second transfer unit 152, and may be disposed above the single-type treating chamber.

The first transfer chamber 220 may be disposed between the first buffer unit 210 and the single-type treating chamber. The first transfer chamber 220 may have a first transfer robot 222. The first transfer robot 222 may take out the substrate W from the first buffer unit 210 and return the substrate W to the single-type treating chamber. The first transfer robot 222 may have a single-type transfer hand that transports a substrate W one by one.

The single-type treating chamber may be disposed on a side of the first transfer chamber 220. The single-type treating chamber may include a single-type liquid treating chamber 230 and a single-type drying chamber 240.

A plurality of single-type treating chambers 230 may be provided. The plurality of single-type treating chambers 230 may be provided and stacked in the up/down direction. The single-type liquid treating chamber 230 may rotate the substrate W in the horizontal posture, but may treat the substrate W by supplying the treating liquid to a rotating substrate W. The single-type liquid treating chamber 230 may treat the substrate W one by one. The treating liquid supplied from the single-type liquid treating chamber 230 may be an organic solvent. For example, the treating liquid supplied from the single-type liquid treating chamber 230 may be an isopropyl alcohol (IPA). In the single-type liquid treating chamber 230, the organic solvent may be supplied to the rotating substrate W, and the substrate W may be dried by rotating the substrate W. Unlike this, in the single-type liquid treating chamber 9230, the organic solvent is supplied to the rotating substrate W, and the substrate W is transferred to the drying chamber 240 to be described later in a state wetted with the organic solvent, so that the substrate W may be dried in the drying chamber 240. A detailed description of the single-type liquid treating chamber 230 will be described later.

A plurality of single-type drying chambers 240 may be provided. The plurality of single-type drying chambers 240 may be provided and stacked in the up/down direction. The single-type drying chamber 240 may treat the substrate W using a supercritical fluid. The single-type drying chamber 240 may be a supercritical chamber in which one substrate W is dried in a single-type manner. The single-type drying chamber 240 may be a supercritical chamber in which the substrate W is dried using a supercritical fluid. A detailed description of the single-type drying chamber 240 will be described later.

The substrate W treated in the single-type treating chamber may be transferred to the second buffer unit 250 by the first transfer robot 222. The second buffer unit 250 may be disposed between the first transfer chamber 220 and the second transfer chamber 260. The second buffer unit 250 may be disposed between the single-type treating chamber and the second load port unit 270.

Similar to the first buffer unit 210, the second buffer unit 250 may provide a space in which the substrate W is temporarily stored or stored. For example, the second buffer unit 250 may temporarily store a substrate W treated in the single-type liquid treating chamber 230 and/or the single-type drying chamber 240 which are single-type treating chambers.

The second transfer chamber 260 may be disposed between the second buffer unit 250 and the second load port unit 270. A second transfer robot 262 may be provided in the second transfer chamber 260. The second transfer robot 262 may transfer a substrate W stored in the second buffer unit 250 after a treatment has been completed to the transfer container F.

A hand of the second transfer robot 262 may be a single-type hand that transfers the substrate W one by one. A transfer hand of the second transfer robot 262 may be provided to be movable along the first direction X, the second direction Y, and the third direction Z. In addition, the transfer hand of the second transfer robot 262 may be rotatably provided with the third direction Z as a rotation axis.

The second load port unit 270 may include at least one load port. A transfer container F capable of storing a plurality of substrates W may be placed on a load port included in the second load port unit 270. For example, the transfer container F placed on the second load port unit 270 may store substrates W in which a treatment has been completed at the first process treating unit 100 and the second process treating unit 200. In the transfer container F placed on the second load port unit 270, only the substrate W in which a treatment has been completed at the first process treating unit 100 and the second treating unit 200 can be stored. That is, the second load port unit 270 may perform a function of unloading the substrate W which has been treated from the substrate treating apparatus.

The above-described second transfer robot 262 may take in the treated substrate W into the container F placed on the load port of the second load port unit 270. The container F may be transferred to an outside of the substrate treating apparatus 10 by an article transfer apparatus (e.g., OHT) described above.

The controller 600 may control the substrate treating apparatus 10. For example, the controller 600 may control components of the substrate treating apparatus 10. For example, the controller 600 may control the substrate treating apparatus 10 so that the substrate treating apparatus 10 may perform a process of treating the substrate W.

The controller may comprise a process controller consisting of a microprocessor (computer) that executes a control of the substrate treating apparatus, a user interface such as a keyboard via which an operator inputs commands to manage the substrate treating apparatus, and a display showing the operation situation of the substrate treating apparatus, and a memory unit storing a treating recipe, i.e., a control program to execute treating processes of the substrate treating apparatus by controlling the process controller or a program to execute components of the substrate treating apparatus according to data and treating conditions. In addition, the user interface and the memory unit may be connected to the process controller. The treating recipe may be stored in a storage medium of the storage unit, and the storage medium may be a hard disk, a portable disk, such as a CD-ROM or a DVD, or a semiconductor memory, such as a flash memory.

Figure 6:
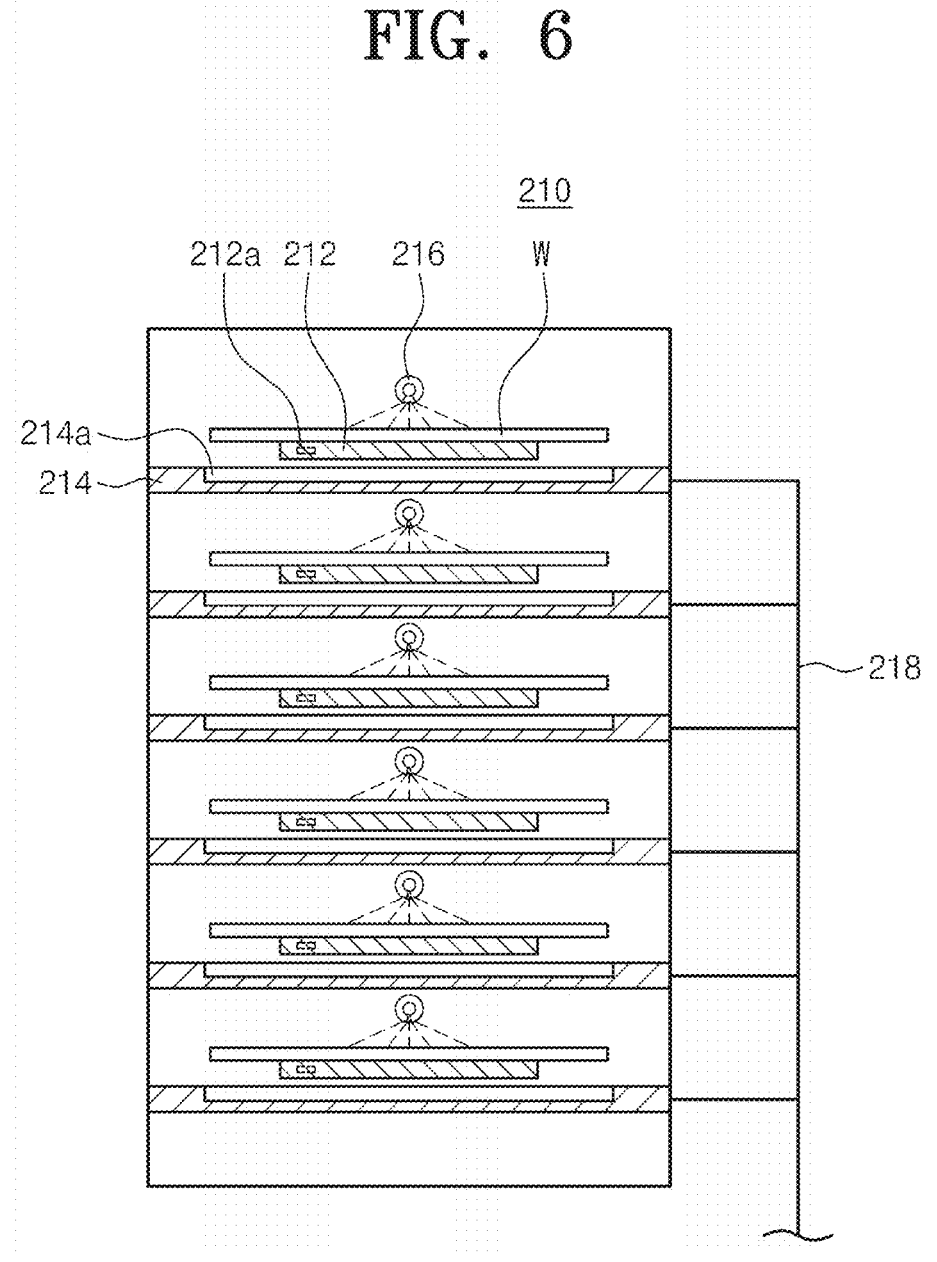
FIG. 6 illustrates a first buffer unit of FIG. 1.

FIG. 6 illustrates the first buffer unit of FIG. 1.

Referring to FIG. 6, the first buffer unit 210 may have a structure of supplying the wetting liquid to the storage space to prevent the substrates W taken into the storage space from becoming dry (to maintain a wettability of the substrate W). In addition, substrates W stored in the first buffer unit 210 may be stored in respective storage spaces divided in the first buffer unit 210.

The first buffer unit 210 may include a support shelf 212, a drain partition 214, a wetting nozzle 216 (an exemplary second wetting nozzle), and a drain line 218.

A plurality of support shelves 212, drain partitions 214, and wetting nozzles 216 may be provided to correspond to each substrate W taken into the first buffer unit 210. The support shelf 212 may support the substrate W in a space provided by the first buffer unit 210. In addition, a weight sensor 212a may be installed at the support shelf 212. The weight sensor senses a weight of the substrate W supported on the support shelf 212 to confirm what an amount of wetting liquid WL supplied onto the substrate W is.

The controller 600 may adjust an amount of the wetting liquid WL per unit time sprayed from the wetting nozzle 216 based on the weight of the substrate W supported by the support shelf 212. The support shelf 212 may be provided to support bottom surfaces of a side and another side of the substrate W.

The wetting nozzle 216 may be configured to spray the wetting liquid in a stream or spray manner. A plurality of wetting nozzles 216 may be provided. A pair of wetting nozzles 216 may spray the wetting liquid onto each substrate W. The wetting nozzle 216 may include a chemical capable of maintaining the wettability of the substrate W transferred to the storage space of the first buffer unit 210, or a nozzle for supplying a mist. The chemical or the mist may supply a wetting liquid selected from an isopropyl alcohol (IPA), the chemical described above, and the rinsing liquid described above.

The drain partition 214 may be disposed under the support shelf 212. The drain partition 214 may be disposed under each of the substrates W supported on the support shelf 212. The drain partition 214 serves as a liquid receiver for receiving the wetting liquid sprayed by the wetting nozzle 216 and may partition spaces in which each substrate W is disposed. The drain partition 214 has a rectangular cylindrical shape with an open top so as to have a liquid receiving space, and the liquid receiving space of the drain partition wall 214 may be connected to the drain line 218. Accordingly, the wetting liquid sprayed by the wetting nozzle 216 may be discharged to an outside.

Figure 7:
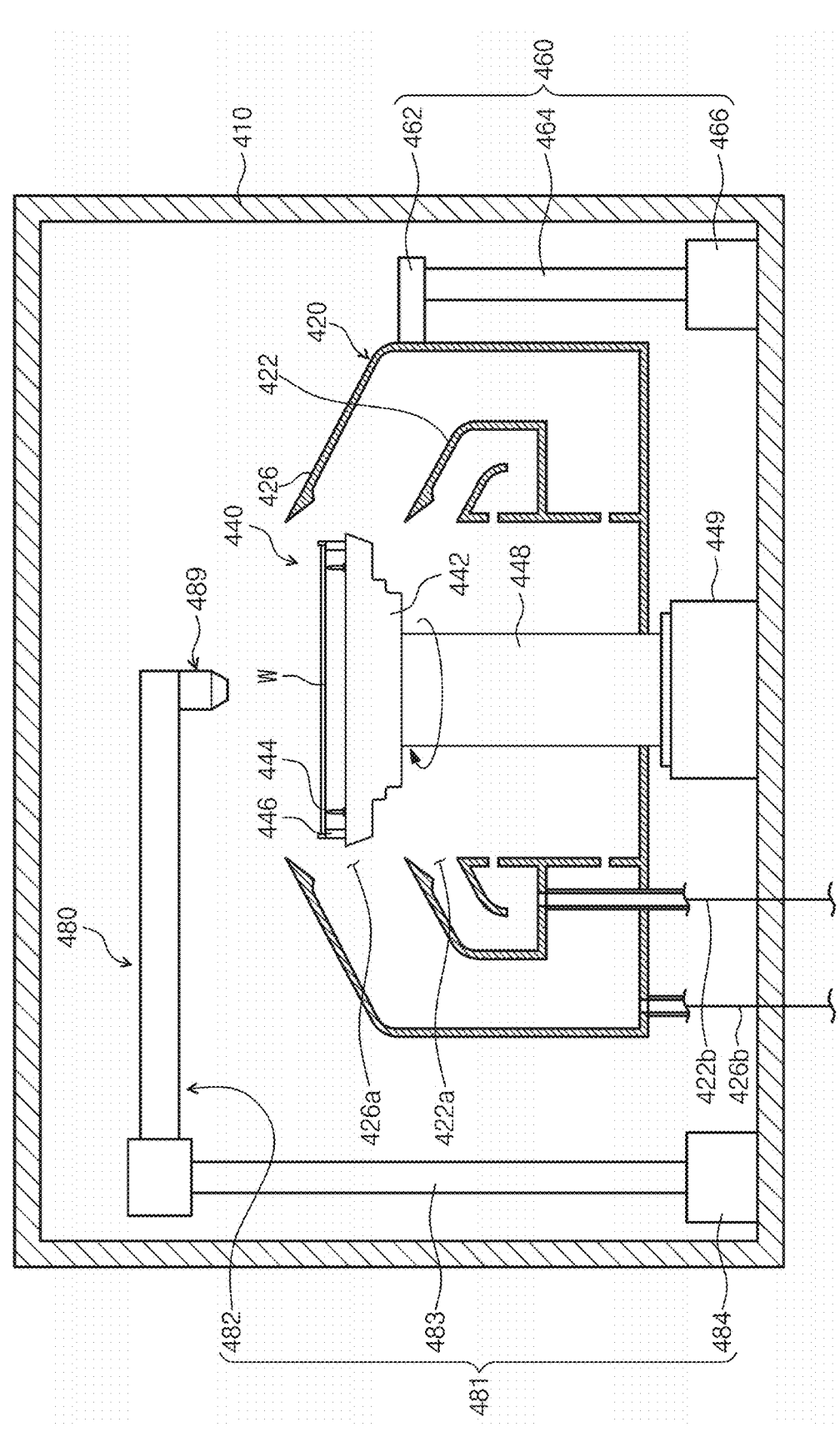
FIG. 7 illustrates a substrate treating apparatus provided in a single-type liquid treating chamber of FIG. 1.

FIG. 7 illustrates a state of the substrate treating apparatus provided in the single-type liquid treating chamber of FIG. 1.

Referring to FIG. 7, the substrate treating apparatus 400 provided to the single-type liquid treating chamber 230 may include a housing 410, a treating container 420, a support unit 440, a lifting/lowering unit 460, and a liquid supply unit 480.

The housing 410 has a treating space 412 therein. The housing 410 may have a cylindrical shape having a space therein. The inner space 412 of the housing 410 may be provided with a treating container 420, a support unit 440, a lifting/lowering unit 460, and a liquid supply unit 480. The housing 410 may have a rectangular shape when viewed from a front surface. However, the inventive concept is not limited thereto, and the housing 410 may be transformed into various shapes that may have a treating space 412.

The treating container 420 has a cylindrical shape with an open top. The treating container 420 has an inner recollecting container 422 and an outer recollecting container 426. Each of the recollecting containers 422 and 426 recollects different treating liquids among the treating liquids used in a process. The inner recollecting container 422 is provided in an annular ring shape surrounding the support unit 440, and the outer recollecting container 426 is provided in an annular ring shape surrounding the inner recollecting container 426. An inner space 422a of the inner recollecting container 422 and the inner recollecting container 422 function as a first inlet 422a through which the treating liquid flows into the inner recollecting container 422. A space 426a between the inner recollecting container 422 and the outer recollecting container 426 functions as a second inlet 426a through which the treating liquid flows into the outer recollecting container 426. According to an embodiment, each inlet 422a and 426a may be positioned at different heights. The recollecting lines 422b and 426b are connected below bottom surfaces of each of the recollecting containers 422 and 426. A treating liquid taken into each of the recollecting containers 422 and 426 can be reused and provided to an outer treating liquid regeneration system (not shown) through the recollecting lines 422b and 426b.

The support unit 440 supports the substrate W in the treating space 412. The support unit 440 supports and rotates the substrate W during the process. The support unit 440 includes a support plate 442, a support pin 444, a chuck pin 446, and rotation driving members 448 and 449.

The support plate 442 is provided in a substantially circular plate shape and has a top surface and a bottom surface. The bottom surface has a smaller diameter than the top surface. That is, the support plate 442 may have a shape of a top wide-bottom narrow structure with a wide top surface and a narrow bottom surface. The top surface and the bottom surface are positioned so that their central axes coincide with each other. In addition, a heating means (not shown) may be provided at the support plate 442. The heating means provided to the support plate 442 may heat the substrate W placed on the support plate 442. The heating means may generate a heat. The heat generated by the heating means may be warm or cold. The heat generated by the heating means may be transferred to the substrate W placed on the support plate 442. In addition, the heat transferred to the substrate W may heat the treating liquid supplied to the substrate W. The heating means may be a heater and/or a cooling coil. However, the inventive concept is not limited thereto, and the heating means may be variously modified by known devices.

A plurality of support pins 444 are provided. The support pin 444 is disposed to be spaced apart at a predetermined space at an edge portion of a top surface of the support plate 442 and upwardly protrudes from the support plate 442. The support pins 444 are arranged to have an annular ring shape as a whole by combination with each other. The support pin 444 supports an edge region of a bottom surface of the substrate W so that the substrate W is spaced apart from the top surface of the support plate 442 by a predetermined distance.

A plurality of chuck pins 446 are provided. The chuck pin 446 is disposed farther from a center of the support plate 442 than the support pin 444. The chuck pin 446 is provided to upwardly protrude from the top surface of the support plate 442. The chuck pin 446 supports a side portion of the substrate W so that the substrate W is not separated from a correct position in a lateral direction when the support plate 442 is rotated. The chuck pin 446 is provided to be linearly moved between an outer position and an inner position along a radial direction of the support plate 442. The outer position is a position farther from the center of the support plate 442 than the inner position. If the substrate W is loaded or unloaded on the support plate 442, the chuck pin 446 is positioned at the outer position, and of a process is performed on the substrate W, the chuck pin 446 is positioned at the inner position. The inner position is a position at which the chuck pin 446 and the side portion of the substrate W contact each other, and the outer position is a position at which the chuck pin 446 and the substrate W are spaced apart from each other.

The rotation driving members 448 and 449 rotate the support plate 442. The support plate 442 may be rotated around its center axis by rotation driving members 448 and 449. The rotation driving members 448 and 449 include a support shaft 448 and a driving unit 449. The support shaft 448 has a cylindrical shape facing the fourth direction 16. A top end of the support shaft 448 is fixedly coupled to the bottom surface of the support plate 442. According to an embodiment, the support shaft 448 may be fixedly coupled to a center of the bottom surface of the support plate 442. The driving unit 449 provides a driving force such that the support shaft 448 is rotated. The support shaft 448 may be rotated by the driving unit 449, and the support plate 442 may be rotated together with the support shaft 448.

The lifting/lowering unit 460 linearly moves the treating container 420 in the up/down direction. As the treating container 420 is moved up and down, a relative height of the treating container 420 with respect to the support plate 442 is changed. If the substrate W is loaded on or unloaded on the support plate 442, the treating container 420 is lowered so that the support plate 442 protrudes above the treating container 420. In addition, if the process is performed, a height of the treating container 420 is adjusted so that the treating liquid may flow into predetermined recollecting containers 422 and 426 according to a type of treating liquid supplied to the substrate W. The lifting/lowering unit 460 has a bracket 462, a moving shaft 464, and a driver 466. The bracket 462 is fixedly installed on an outer wall of the treating container 420, and the moving shaft 464 which is moved in the up/down direction by the driver 466 is fixedly coupled to the bracket 462. Selectively, the lifting/lowering unit 460 may move the support plate 442 in the up/down direction.

The liquid supply unit 480 may supply the treating liquid to the substrate W. The treating liquid may be an organic solvent, the chemical or the rinsing liquid described above. The organic solvent may be an isopropyl alcohol (IPA) liquid.

The liquid supply unit 480 may include a moving member 481 and a nozzle 489. The moving member 481 moves the nozzle 489 to a process position and a standby position. The process position is a position at which the nozzle 489 faces the substrate W supported by the support unit 440. According to an embodiment, the process position is a position at which the treating liquid is discharged to the top surface of the substrate W. The process position also includes a first supply position and a second supply position. The first supply position may be a position closer to the center of the substrate W than the second supply position, and the second supply position may be a position including an end of the substrate. Selectively, the second supply position may be a region adjacent to the end of the substrate. The standby position is defined as a position at which the nozzle 489 deviates from the process position. According to an embodiment, the standby position may be a position at which the nozzle 489 stands-by before or after a process treatment is completed on the substrate W.

The moving member 481 includes an arm 482, a support shaft 483, and a driver 484. The support shaft 483 is positioned at a side of the treating container 420. The support shaft 483 has a rod shape with its lengthwise direction in the fourth direction. The support shaft 483 may be provided to be rotatable by the driver 484. The support shaft 483 is provided to be able to move up and down. The arm 482 is coupled to the top end of the support shaft 483. The arm 482 extends vertically from the support shaft 484. A nozzle 489 is coupled to an end of the arm 482. As the support shaft 483 is rotated, the nozzle 489 may swing together with the arm 482. The nozzle 489 may be swing-moved to the process position and the standby position. Selectively, the arm 482 may be provided to be capable of being forwardly and backwardly moved in its lengthwise direction. When viewed from above, a path through which the nozzle 489 moves may coincide with a central axis of the substrate W at the process position.

Figure 8:
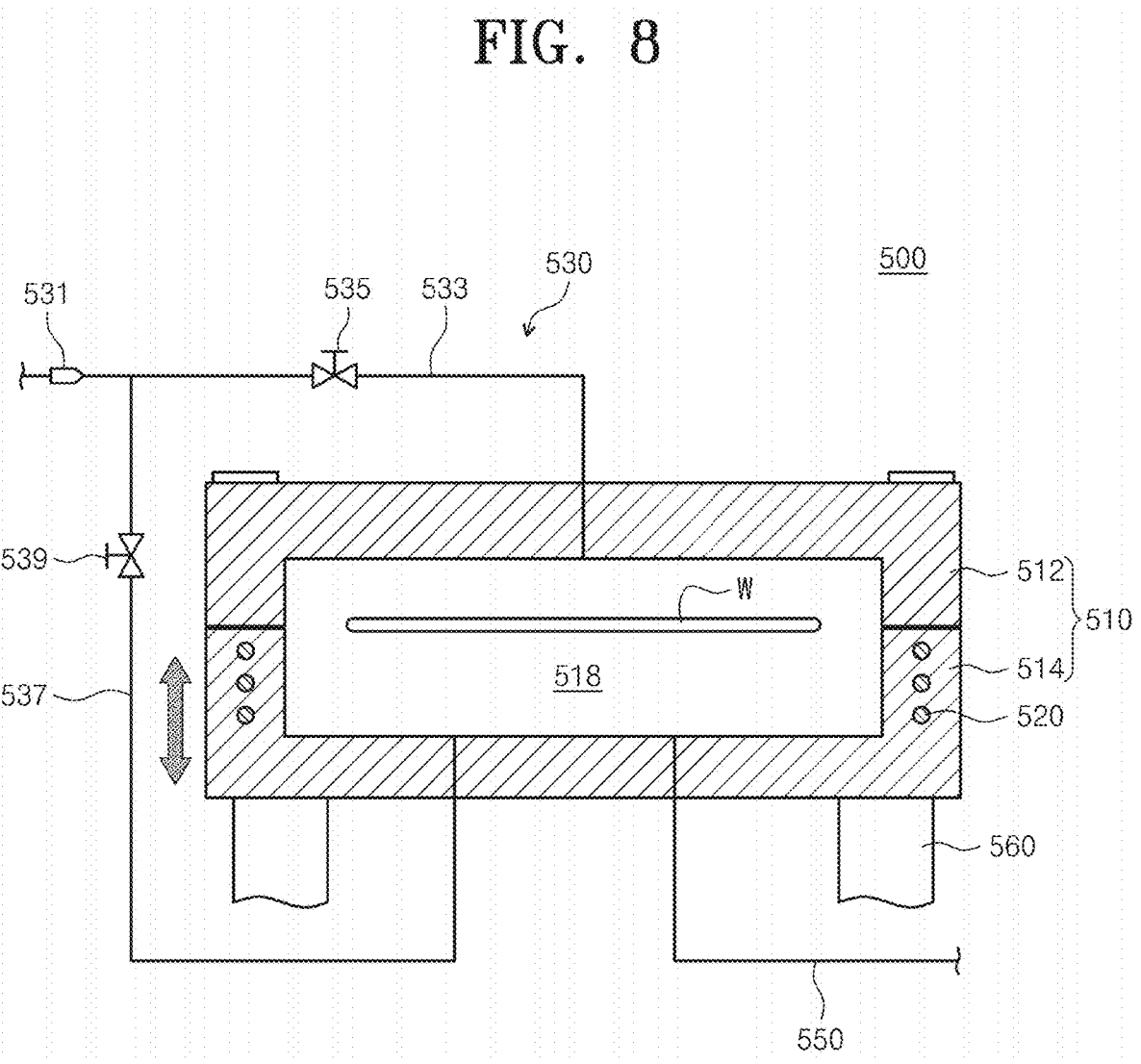
FIG. 8 illustrates a substrate treating apparatus provided in the single-type drying chamber of FIG. 1.

FIG. 8 illustrates the substrate treating apparatus provided in the single-type drying chamber of FIG. 1.

Referring to FIG. 8, the substrate treating apparatus 500 provided to the single-type drying chamber 240 may remove the treating liquid remaining on the substrate W by using a drying fluid G in a supercritical state. The drying chamber 500 can be a supercritical chamber which removes the treating liquid (e.g., a rinsing liquid or an organic solvent) remaining on the substrate W using the supercritical fluid.

For example, the substrate treating apparatus 500 provided in the single-type drying chamber 240 may perform a drying process of removing the organic solvent remaining on the substrate W using a carbon dioxide ($CO_2$) in the supercritical state.

The substrate treating apparatus 500 provided in the single-type drying chamber 240 may include a body 510, a heating member 520, a fluid supply unit 530, a fluid exhaust unit 550, and a lifting/lowering member 560. The body 510 may have an inner space 518 in which the substrate W is treated. The body 510 may provide an inner space 518 in which the substrate W is treated. The body 510 may provide an inner space 518 at which the substrate W is dried by the drying fluid G in the supercritical state.

The body 510 may include a top body 512 and a bottom body 514. The top body 512 and the bottom body 514 may be combined with each other to form the inner space 518. The substrate W may be supported in the inner space 518. For example, the substrate W may be supported by a support member (not shown) in the inner space 518. The support member may be configured to support a bottom surface of the edge region of the substrate W. Any one of the top body 512 or the bottom body 514 may be coupled to the lifting/lowering member 560 to be moved in the up/down direction. For example, the bottom body 514 may be coupled to the lifting/lowering member 560 and may be moved in the up/down direction by the lifting/lowering member 560. Accordingly, the inner space 518 of the body 510 may be selectively sealed. Although the above-described example has been described as an example in which the bottom body 514 is coupled to the lifting/lowering member 560 and moves in the up/down direction, the inventive concept is not limited to it. For example, the top body 512 may be coupled to the lifting/lowering member 560 to move in the up/down direction.

The heating member 520 may heat the drying fluid G supplied to the inner space 518. The heating member 520 may increase a temperature of the inner space 518 of the body 510 to phase-change the drying fluid G supplied to the inner space 518 into the supercritical state. In addition, the heating member 520 may increase the temperature of the inner space 518 of the body 510 so that the drying fluid G in a supercritical state supplied to the inner space 518 maintains the supercritical state.

In addition, the heating member 520 may be embedded in the body 510. For example, the heating member 520 may be embedded in any one of the top body 512 or the bottom body 514. For example, the heating member 520 may be provided in the bottom body 514. However, the inventive concept is not limited thereto, and the heating member 520 may be provided at various positions capable of increasing the temperature of the inner space 518. In addition, the heating member 520 may be a heater. However, the inventive concept is not limited thereto, and the heating member 520 can be variously modified as a known device capable of increasing the temperature of the inner space 518.

The fluid supply unit 530 may supply the drying fluid G to the inner space 518 of the body 510. The drying fluid G supplied by the fluid supply unit 530 may include a carbon dioxide $CO_2$. The fluid supply unit 530 may include a fluid supply source 531, a first supply line 533, a first supply valve 535, a second supply line 537, and a second supply valve 539.

The fluid supply source 531 may store and/or supply the drying fluid G supplied to the inner space 518 of the body 510. The fluid supply source 531 may supply the drying fluid G to the first supply line 533 and/or the second supply line 537. For example, the first supply valve 535 may be installed on the first supply line 533. In addition, the second supply valve 539 may be installed on the second supply line 537. The first supply valve 535 and the second supply valve 539 may be on/off valves. According to on/off of the first supply valve 535 and the second supply valve 539, the drying fluid G may selectively flow through the first supply line 533 or the second supply line 537.

In the above-described example, the first supply line 533 and the second supply line 537 are connected to one fluid supply source 531, but are not limited thereto. For example, a plurality of fluid supply sources 531 may be provided, the first supply line 533 may be connected to one of the plurality of fluid supply sources 531, and the second supply line 537 may be connected to another other of the fluid supply sources 531.

Also, the first supply line 533 may be a top supply line which supplies a drying gas from above of the inner space 518 of the body 510. For example, the first supply line 533 may supply the drying gas to the inner space 518 of the body 510 in a direction from a top to a bottom.

For example, the first supply line 533 may be connected to the top body 512. Also, the second supply line 537 may be a bottom supply line which supplies the drying gas from below the inner space 518 of the body 510. For example, the second supply line 537 may supply the drying gas to the inner space 518 of the body 510 in a direction from the bottom to the top. For example, the second supply line 537 may be connected to the bottom body 514.

The fluid exhaust unit 550 may exhaust the drying fluid G from the inner space 518 of the body 510.

Figure 9:
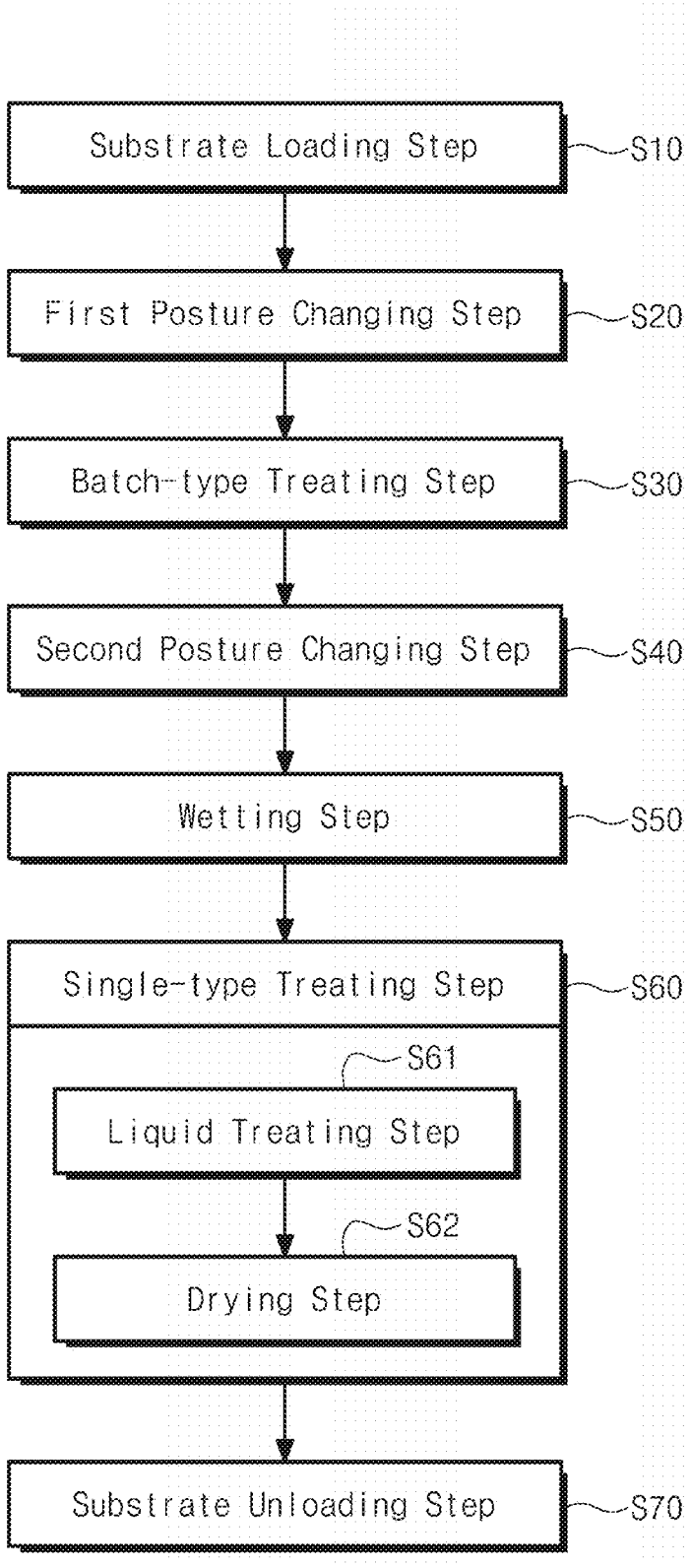
FIG. 9 is a flowchart illustrating a substrate treating method according to an embodiment of the inventive concept.

FIG. 9 is a flowchart illustrating a substrate treating method according to an embodiment of the inventive concept.

Referring to FIG. 9, the substrate treating method according to an embodiment of the inventive concept may include a substrate loading step S10, a first posture changing step S20, a batch-type treating step S30, a second posture changing step S50, a single-type treating step S60, and a substrate unloading step S70.

In the substrate loading step S10, a so-called untreated substrate W requiring a treatment may be loaded on the substrate treating apparatus 10. In the substrate loading step S10, the transfer container F may be placed in the first load port unit 110.

The substrate W stored in the transfer container F may be taken out by the index robot 122 and transferred to the storage container C.

In the first posture changing step S20, the posture of the substrate W may be changed from the horizontal posture to the vertical posture. In the first posture changing step S20, the posture of the substrate W may be changed by rotating the storage container C in the first direction X by the posture changing unit 124. The posture changing unit 124 may have a rotation shaft capable of rotating the storage container C in the first direction X as an axis.

The substrate W changed to the vertical posture may be transferred to the first batch-type treating unit 141 by the first transfer unit 132.

In the batch-type treating step S30, a liquid treatment on the substrate W may be performed. In the batch-type treating step S30, substrates W may be returned to at least one batch-type treating bath 1441-B1 to 143-B2 to perform the liquid treatment on the substrate W. The batch-type treating step S30 may be performed in a manner in which a pre-treatment is performed at the first batch-type treating unit 141, a post-treatment is performed at the second batch-type treating unit 142 or the third batch-type treating unit.

For example, the substrate W transferred to the first batch-type treating unit 141 may be liquid-treated at the 1-1 batch-type treating bath 141-B1 and/or the 1-2 batch-type treating bath 141-B2. A substrate W which liquid-treated at the 1-1 batch-type treating bath 141-B1 and/or the 1-2 batch-type treating bath 141-B2 may be transferred to any selected one of the second batch-type treating unit 142 or the third batch-type treating unit 143 for a treatment.

For example, when the substrate W is transferred to the second batch-type treating unit 142, the substrate W may be first treated by a chemical containing phosphoric acid in the 2-1 batch-type treating bath 142-B1, and then rinsed by a rinsing liquid containing water in the 2-2 batch-type treating bath 142-B2.

The substrates W which have been rinsed may be transferred to the posture changing treating bath 151 by the second transfer unit 134.

The second posture changing step S40 may be performed at the posture changing unit 150. The second posture changing step S40 may include a holding step of holding the substrate W and a rotation step of changing the posture of the substrate W.

Figure 10:
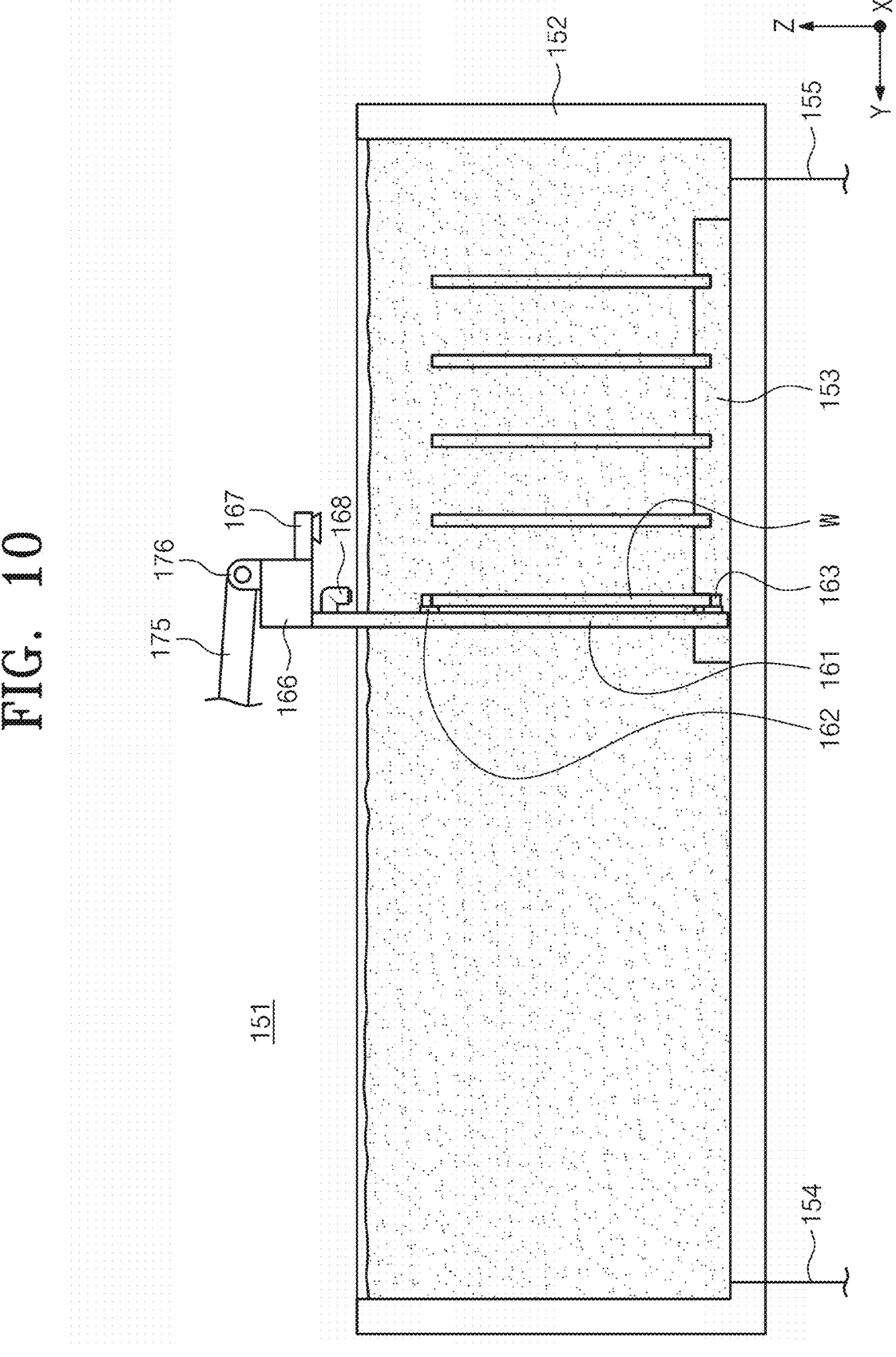
FIG. 10 and FIG. 11 illustrates a state in which the posture changing robot changes a posture of a substrate to a horizontal posture in a second posture changing step of FIG. 9.

For example, as shown in FIG. 10, in the holding step of the second posture changing step S40, the hand 156-H may approach any one of the substrates W supported by the support member 153 in a vertical posture. The hand 156-H may be moved so that the substrate W may be positioned between the first guide portion 162 and the second guide portion 163. If the substrate W is positioned between the first guide portion 162 and the second guide portion 163, the chucking body 165 may move to the chucking position to hold the substrate W.

If the hand 156-H holds the substrate W, the substrate W may be upwardly moved so that the substrate W may escape from the support groove formed at the support member 153.

Figure 11:

Thereafter, as shown in FIG. 11, in the rotation step of the second posture changing step S40, the substrate W may be linearly moved along a direction to change the position of the substrate W while rotating the substrate W based on an axis of the rotation member 166. That is, in the rotation step, the substrate W may be simultaneously rotated and linearly moved. In this case, a position of an end of the substrate W may be changed while drawing a virtual curve (e.g., a parabola). That is, the posture of the substrate W may be changed from the vertical posture to the horizontal posture in a state immersed in the treating liquid L while drawing the parabola. In addition, a difference between a time at which a rotation of the substrate W ends and a time at which a linear movement of the substrate W ends may be less than or equal to a set time. For example, these two time points may be the same time point. That is, at a time point at which the linear movement of the substrate W is finished, the rotation of the substrate W by the rotation member 166 may be simultaneously be terminated.

In addition, while the substrate W is held and the substrate W is rotated, the vision member 167 may not be immersed in the treating liquid L. That is, the vision member 167 may be installed at a position which is not immersed in the treating liquid L stored in the posture changing treating bath 151. Accordingly, it is possible to minimize a problem of the vision member 167 being damaged by the treating liquid L.

If the posture of the substrate W is changed to a state in which the substrate W is immersed in the treating liquid L, the substrate W may be damaged by a resistance of the treating liquid L. However, as in the inventive concept, if the posture is changed while the substrate W is immersed in the treating liquid L by drawing a curve, it is possible to suppress the resistance caused by the treating liquid L from being transferred to the substrate W as much as possible. In addition, if the substrate W is moved away from the treating liquid L (i.e., exposed to air) and the posture is changed, the wettability of the substrate W may not be maintained and a water mark may be generated on the substrate W, and this problem can be minimized by changing the posture of the substrate W while the substrate W is immersed in the treating liquid L.

After the second posture changing step S40 is performed, the wetting step S50 may be performed. The wetting step S50 may be performed between the second posture changing step S40 and the single-type treating step S60.

The wetting step S50 may be performed by the posture changing robot 156 and/or the first buffer unit 210. In the wetting step S50, a natural drying of the substrate W may be prevented by spraying the wetting liquid to the substrate W exposed to the outside away from the treating liquid L. The wetting liquid may be the same type of liquid as the treating liquid L stored in the above-described posture changing treating bath 151. In contrast, the wetting liquid may be a type of liquid different from the above-described treating liquid L.

Figure 12:
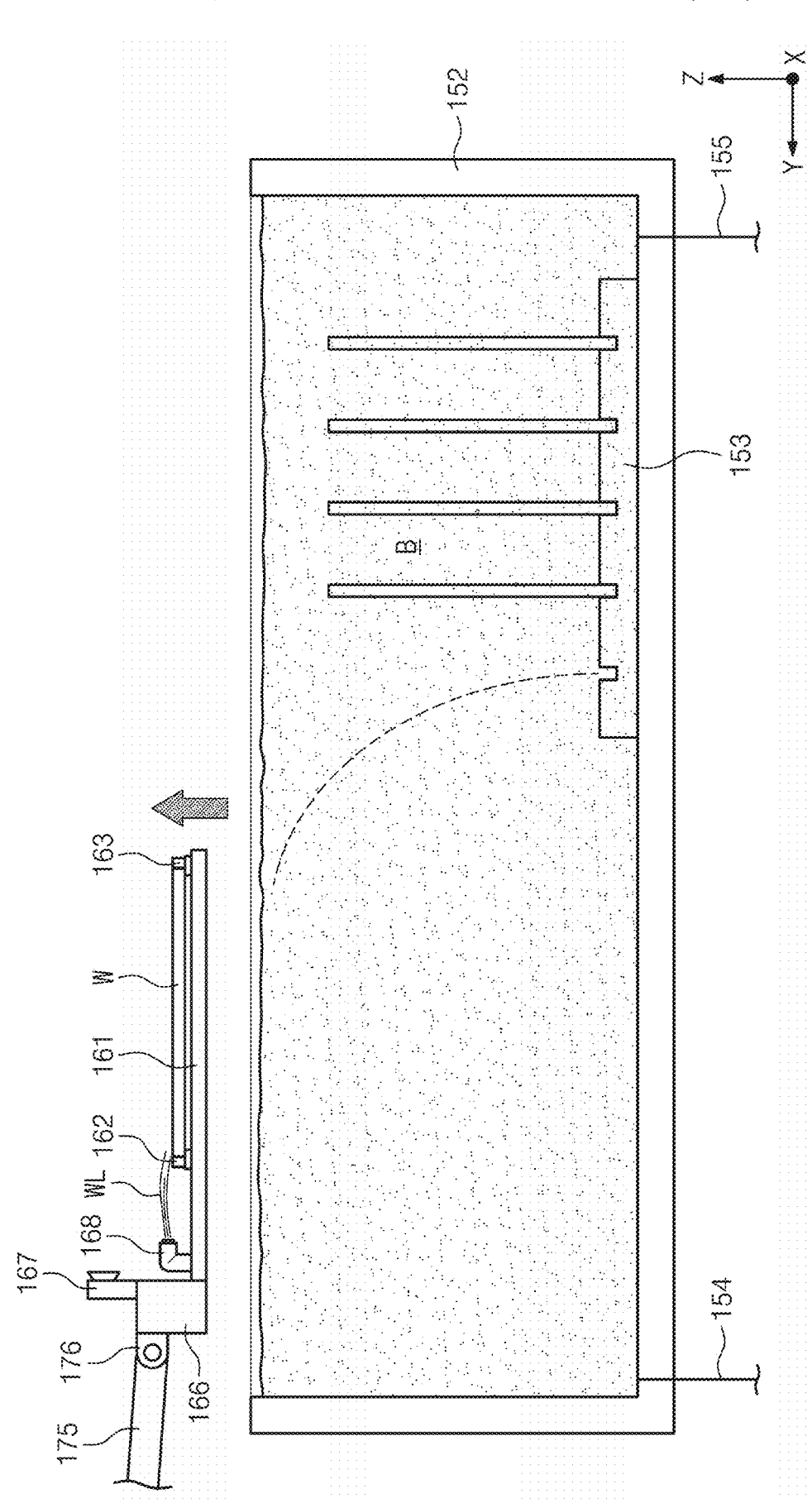
FIG. 12 illustrates the posture changing robot performing a wetting step of FIG. 9.
Figure 13:
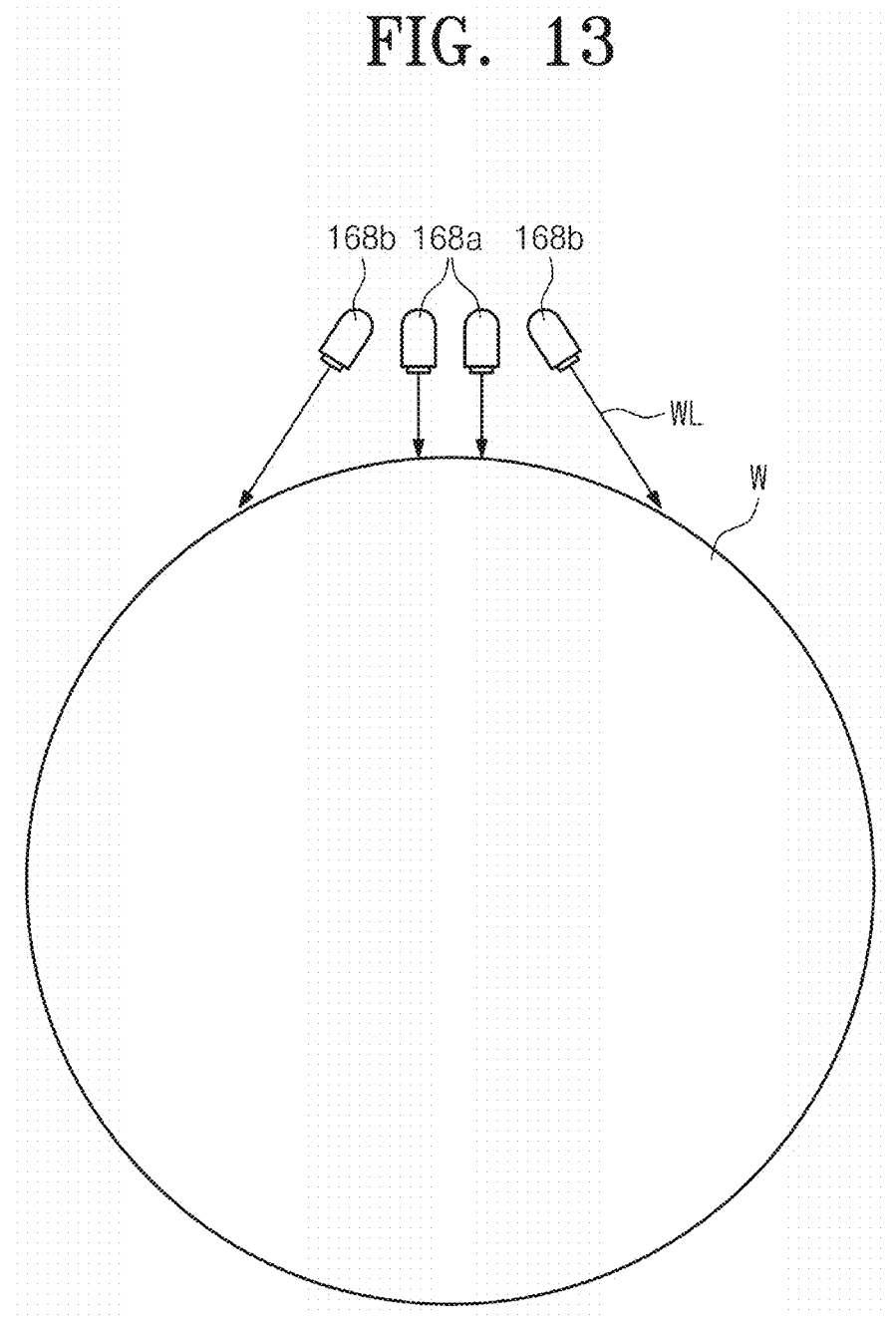
FIG. 13 is a top view illustrating a state in which a liquid supply member supplies a wetting liquid at the wetting step of FIG. 9.
Figure 14:
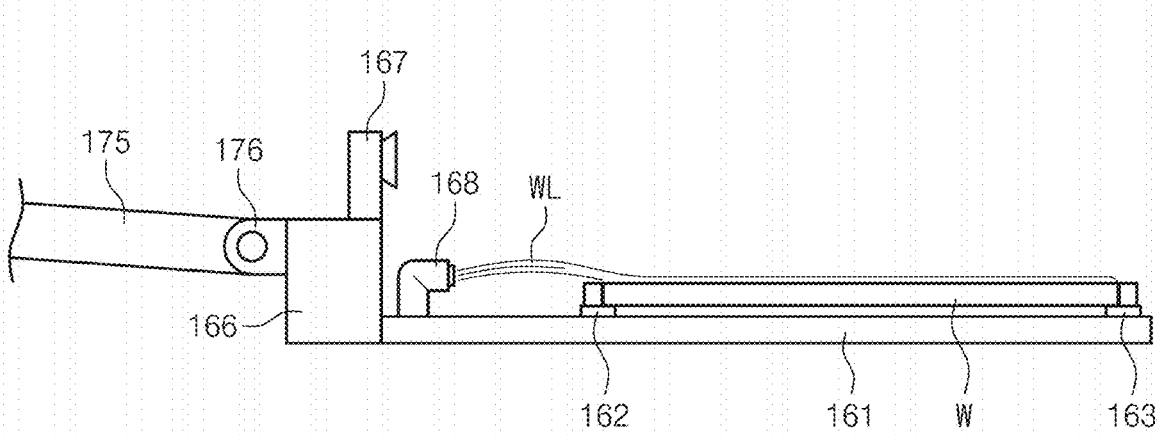
FIG. 14 is a side view illustrating a state in which the liquid supply member supplies the wetting liquid at the wetting step of FIG. 9.

For example, as illustrated in FIG. 12, a posture changing of the substrate W is completed, and the posture changing robot 156 may upwardly move the substrate W to deviate from the treating liquid L stored at the posture changing treating bath 152. If the substrate W deviates from the treating liquid L, the liquid supply member 168 may supply the wetting liquid WL. In this case, as shown in FIG. 13 and FIG. 14, the wetting liquid WL may be supplied to the first region and the second region which are edge regions of the substrate W. The wetting liquid WL supplied to the edge region of the substrate W may flow along the top surface of the substrate W to form a liquid film on the top surface of the substrate W. If the wetting liquid WL flows along the edge region of the substrate W to form the liquid film, a splashing of the wetting liquid WL is maximally suppressed, thereby making a more efficient treatment of the substrate W possible.

Also, the wetting step S50 may be performed at the first buffer unit 210 as described above. The substrate W on which the second posture changing step S40 is performed may be transferred to the first buffer unit 210 by the posture changing robot 156. In the wetting step S30, if the substrate W is taken into the first buffer unit 210, the wetting nozzle 216 of the first buffer unit 210 may spray the wetting liquid to the substrate W.

As the wetting step S30 is performed, it is possible to minimize the natural drying of the substrate W before the substrate W is taken into the single-type treating chamber.

The single-type treating step S60 may include a liquid treating step S61 and a drying step S62.

In the liquid treating step S61, the substrate W may be liquid-treated in a single-type manner. The liquid treating step S61 may be performed at the single-type liquid treating chamber 230 if the substrate W temporarily stored at the first buffer unit 210 is transferred to to the single-type liquid treating chamber 230. In the liquid treating step S40, an organic solvent such as an IPA may be supplied onto the substrate W.

In the drying step S62, the substrate W may be dried in a single-type manner. The drying step S62 can be performed at the drying chamber 240 if the substrate W which is liquid treated in the liquid treatment step S61 is transferred to the drying chamber 240. In the drying step S50, a treating fluid in a supercritical state (e.g., supercritical carbon dioxide) may be supplied to the substrate W to remove an organic solvent, a wetting liquid, or a treating liquid L remaining on the substrate.

In some cases, the drying step S50 may not be performed at the drying chamber 240, but the substrate W may be dried by rotating the substrate W at the single-type liquid treating chamber 230 at a high speed (so-called spin drying).

A substrate W on which the single-type treating step S60 has been performed may be transferred to the second buffer unit 250 and then transferred to the transfer container F placed in the second load port unit 270 by the second transfer robot 262 of the second transfer chamber 260.

As described above, the substrate treating apparatus 10 according to an embodiment of the inventive concept may include both a batch-type treating unit 140 and a single-type liquid treating chamber 230. Accordingly, it may have all the advantages of the batch-type liquid treating method and the single-type liquid treating method.

For example, since the batch-type treating unit 140 may treat a plurality of substrates W at once, a mass productivity of the substrate W treatment is excellent, and a treatment uniformity between the substrates W is very high. In addition, if the pattern formed on the substrate W has a high aspect ratio, the batch-type treating unit 140 may supplement a portion that has not quite been treated (e.g., a portion that has not quite been etched) by supplying a chemical, a rinsing liquid, etc. from the single-type liquid treating chamber 230. In addition, the substrate W (e.g., a wafer) wetted by the organic solvent supplied from the single-type liquid treating chamber 230 or the first buffer unit 210 may be transferred to the drying chamber 240 for drying the substrate W by supplying a supercritical fluid. The supercritical fluid may have a high penetration force with respect to a space between patterns formed on the substrate W and may dry the substrate W without rotating the substrate W, thereby minimizing the above-described pattern leaning phenomenon. In addition, the substrate treating apparatus 10 of the inventive concept may perform all of the single-type liquid treating method, the batch-type liquid treating method, and the method of drying the substrate W using the supercritical fluid, thereby improving defects due to a particle, a falling, and a flowability. In addition, since the number of substrates W that can be treated at the batch-type treating unit 140 is relatively large, a large number of liquid treating chambers are not required, and thus a footprint of the substrate treating apparatus 10 may be reduced. In addition, as described above, by further including the single-type liquid treating chamber 230, it is possible to solve a problem of an abnormal growth of $SiO_2$ on a pattern on the substrate W that may occur if the substrate W is treated using only the batch-type treating unit 140.

In addition, like the substrate treating apparatus 10 according to an embodiment of the inventive concept, if both the batch-type treating unit 140 and the single-type liquid treating chamber 230 are provided, it is essential to change the posture of the substrate W from the vertical posture to the horizontal posture. Accordingly, the substrate treating apparatus 10 according to an embodiment of the inventive concept includes a posture changing robot 156 to change the posture of the substrate W from the vertical posture to the horizontal posture. In this case, the posture change of the substrate W is conducted in a state in which the substrate W is immersed in the treating liquid L so as to maintain the wettability of the substrate W as much as possible (if not, the substrate W may dry and generate a water mark).

Figure 15:
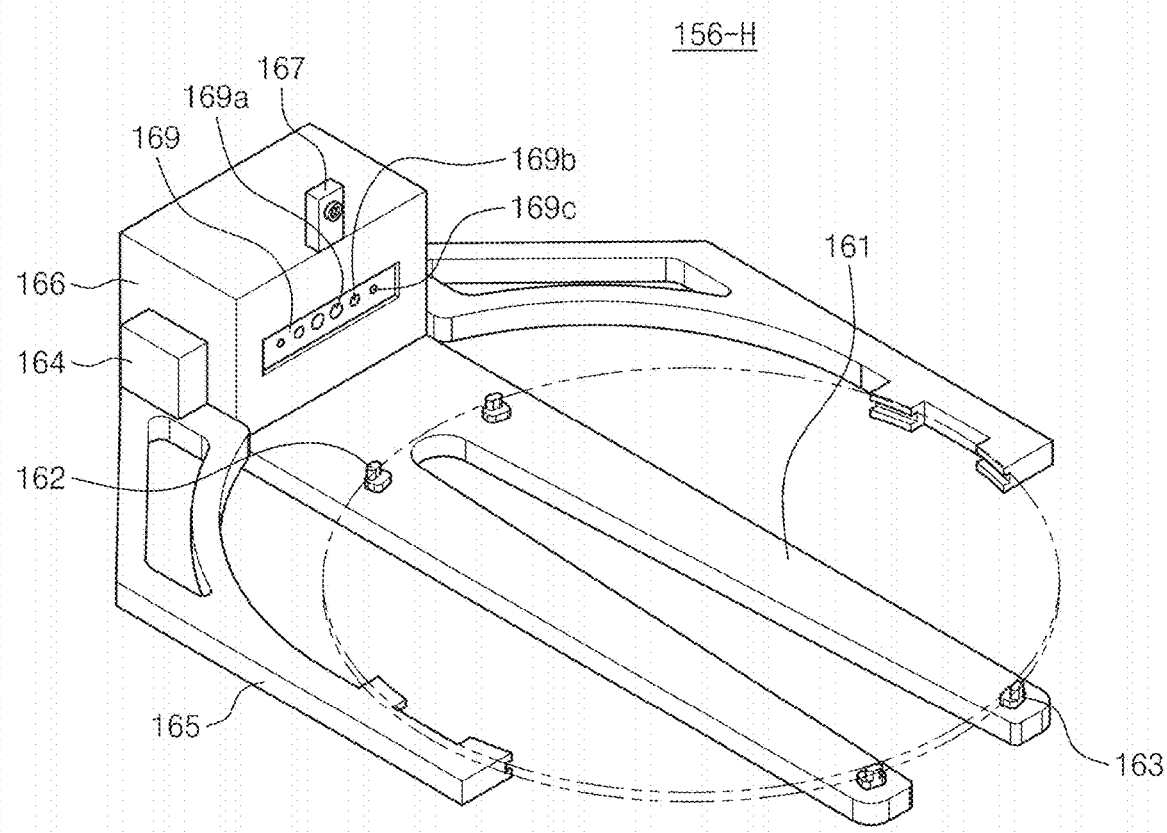
FIG. 15 illustrates the hand according to another embodiment of the inventive concept.
Figure 16:
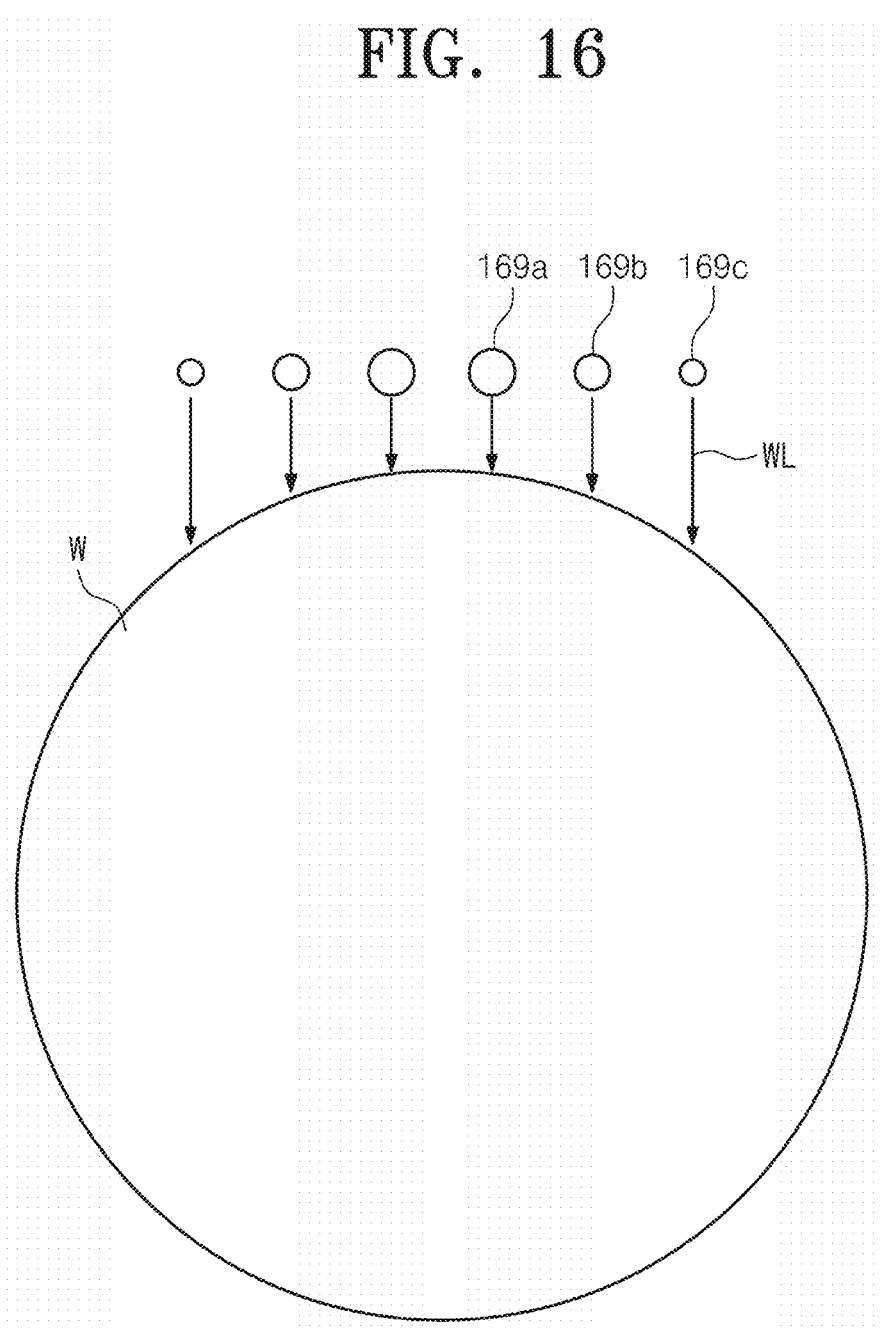
FIG. 16 is a top view illustrating a state in which the liquid supply member of FIG. 15 supplies the wetting liquid to the substrate.

In the above-described example, it has been described that the liquid supply member 168 is installed on the support body 161, but the inventive concept is not limited thereto. For example, as shown in FIG. 15, the liquid supply member 169 may be installed on the fastening body 166. The liquid supply member 169 may be a supply pipe on which a first nozzle 169*a*, a second nozzle 168*b*, and a third nozzle 166*c* are formed. The first nozzle 169*a*, the second nozzle 168*b*, and the third nozzle 166*c* may spray the wetting liquid WL toward the substrate W in a downwardly inclined direction. At least one of the first nozzle 169*a*, the second nozzle 168*b*, and the third nozzle 166*c* may be formed. For example, a plurality of first nozzles 169*a*, a plurality of second nozzles 168*b*, and a plurality of third nozzles 166*c* may be formed. The first nozzles 169*a* may be disposed between the second nozzles 169*b*, and the second nozzles 169*b* may be disposed between the third nozzles 169*c*. The first nozzles 169*a* may be disposed relatively at an inner side, and the third nozzles 169*c* may be disposed relatively at an outer side. Also, as illustrated in FIG. 16, diameters of spray holes of the first nozzle 169*a*, the second nozzle 168*b*, and the third nozzle 168*c* may be different from each other. A diameter of the spray hole of the first nozzle 166*a* may be larger than that of the second nozzle 168*b*, and a diameter of the spray hole of the second nozzle 169*b* may be larger than that of the third nozzle 166*c*. Furthermore, a supply flow rate of the wetting liquid WL per unit time transferred to the first nozzle 169*a*, the second nozzle 168*b*, and the third nozzle 168*c* may be the same. Accordingly, regarding a spraying distance of the wetting liquid WL supplied from the first nozzle 169*a*, the second nozzle 168*b*, and the third nozzle 166*c*, the first nozzle 169*a* may be the shortest, and the third nozzle 169*c* may be the longest. In addition, the first nozzle 169*a*, the second nozzle 168*b*, and the third nozzle 168*c* may supply the wetting liquid WL to the edge region of the substrate W.

Figure 17:
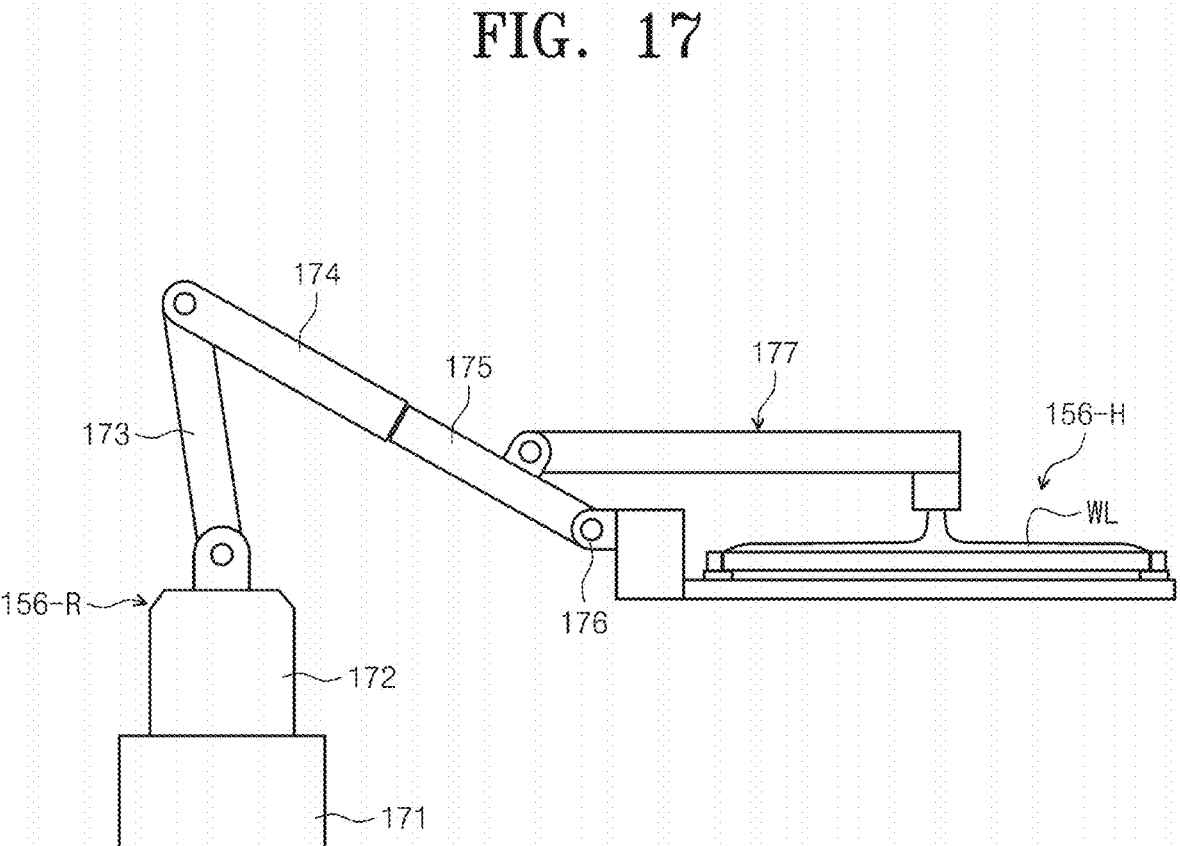
FIG. 17 illustrates the posture changing robot according to another embodiment of the inventive concept.

In the above-described example, it has been described that the posture changing robot 156 supplies the wetting liquid WL to the edge region of the substrate W, but the inventive concept is not limited thereto. For example, as shown in FIG. 17, the liquid supply member 177 may be fastened to the third arm 175. In addition, the liquid supply member 177 may be provided to be rotatable with a direction parallel to a rotation axis of the fourth arm 176 as a rotation axis, and may be configured to supply the wetting liquid WL to a center region of the substrate W placed on the hand 156-H.

Figure 18:
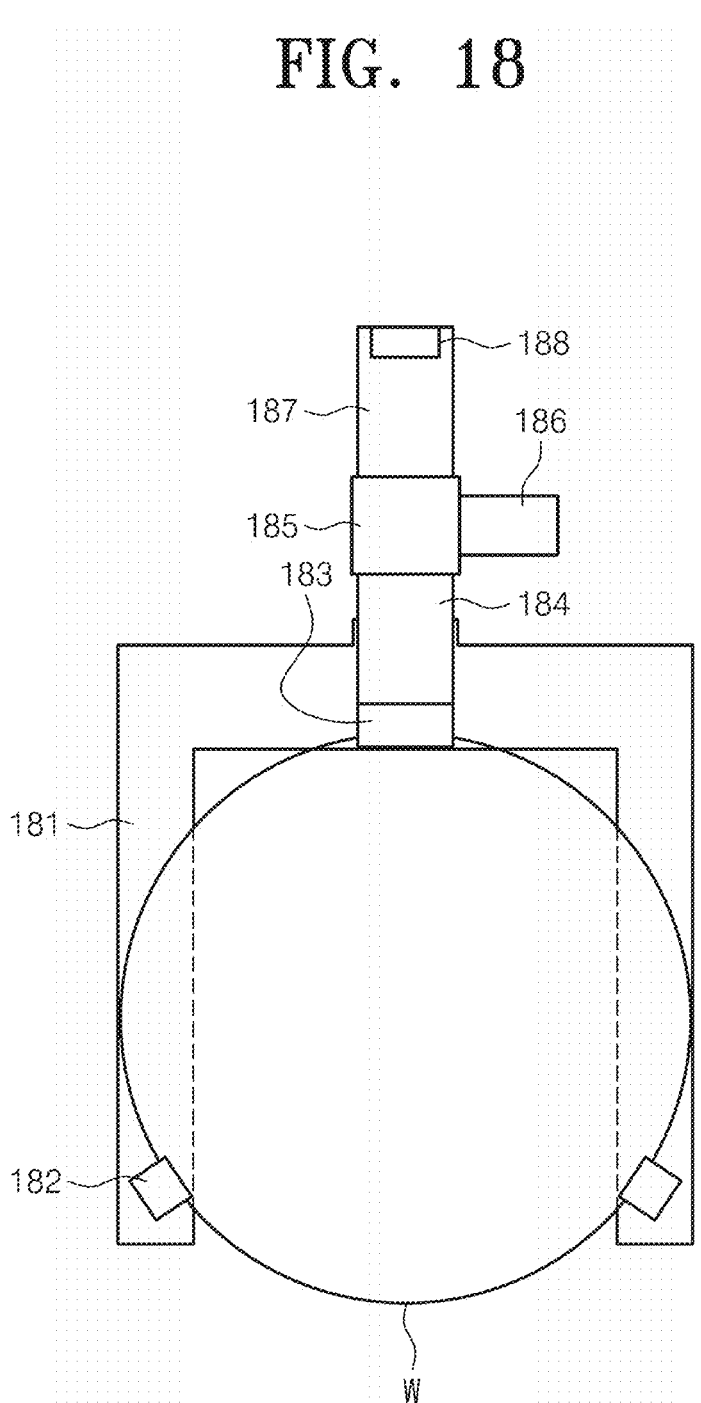
FIG. 18 is a top view of the hand according to another embodiment of the inventive concept.
Figure 19:
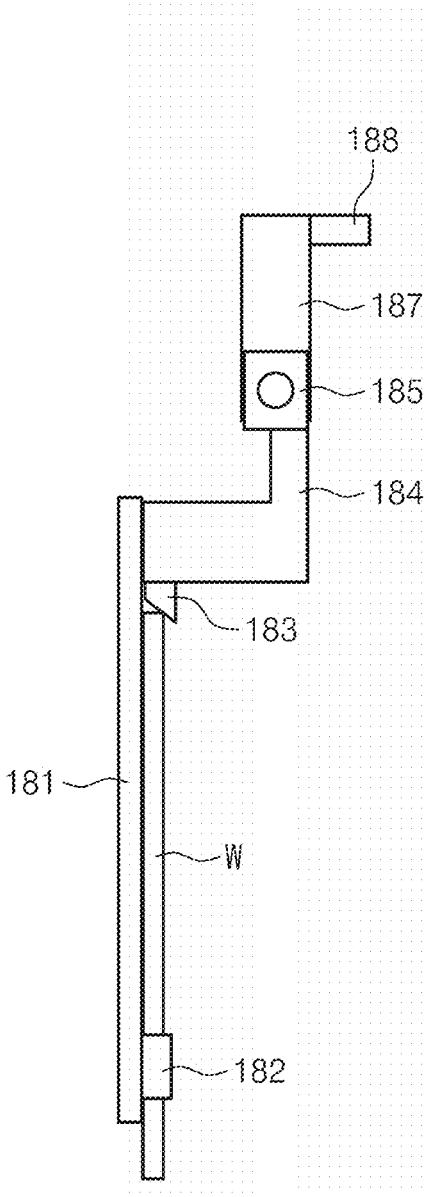
FIG. 19 is a side view of the hand of FIG. 18.

FIG. 18 is a top view of the hand according to another embodiment of the inventive concept, and FIG. 19 is a side view of the hand of FIG. 18.

Referring to FIG. 18 and FIG. 19, the hand 156-H1 according to another embodiment that the posture changing robot 156 may have may include a support body 181, a guide portion 182, a chucking body 183, a driving member 184, a rotation member 185, a rotation motor 186, a connection body 187, and a vision member 188.

The support body 181 may have a finger shape. The guide portion 182 may be provided at a distal end of the support body 181. The guide portion 182 may support a side portion of the substrate W, and the support body 181 may support the bottom surface of the substrate W.

The chucking body 183 may move in a direction by the driving member 184. The chucking body 183 may be moved between a chucking position for chucking the substrate W and a standby position for not chucking the substrate W by the driving member 184. The rotation member 185 may rotate the support body 181 and the substrate W based on an axis, and the rotation motor 186 may transfer a driving force for rotating the rotation member 185. The connection body

187 may be connected to the joint portion 156-R of the posture changing robot 156. The vision member 188 may perform the same or a similar function as the above-described vision member 167. In addition, similar to the vision member 167, the vision member 188 may be installed at a position which is not immersed in the treating liquid L stored in the posture changing treating bath 151 when the posture of the substrate W is changed.

In the above-described example, the substrate treating apparatus 10 according to an embodiment of the inventive concept includes both a single-type liquid treating chamber 230 and a drying chamber 240, but is not limited thereto. For example, the substrate treating apparatus 10 may include only one of the single-type liquid treating chamber 230 and the drying chamber 240.

In the above-described example, the substrate W taken out from the batch-type treating unit 140 is transferred to the single-type liquid treating chamber 230, and after the substrate W treatment is completed at the single-type liquid treating chamber 230, the substrate W is transferred to the drying chamber 240. For example, if a particle level is good, the substrate W may be directly transferred to the drying chamber 240 from the batch-type liquid treating chamber 140.

The effects of the inventive concept are not limited to the above-mentioned effects, and the unmentioned effects can be clearly understood by those skilled in the art to which the inventive concept pertains from the specification and the accompanying drawings.

Although the preferred embodiment of the inventive concept has been illustrated and described until now, the inventive concept is not limited to the above-described specific embodiment, and it is noted that an ordinary person in the art, to which the inventive concept pertains, may be variously carry out the inventive concept without departing from the essence of the inventive concept claimed in the claims and the modifications should not be construed separately from the technical spirit or prospect of the inventive concept.

What is claimed is:

1. A substrate treating apparatus comprising:
a treating bath having an accommodation space for accommodating a treating liquid;
a support member configured to support at least one substrate in a vertical posture at the accommodation space; and
a posture changing robot configured to change a posture of the substrate immersed in the treating liquid from the vertical posture to a horizontal posture, and
wherein the posture changing robot comprises:
a body configured to hold the substrate thereon, the body including
a joint portion; and
a hand coupled to the joint portion, the hand including a fastening body configured to couple the hand to the joint portion and a support body configured to support the substrate; and
a liquid supply member configured to supply a wetting liquid to the substrate placed on the body, the liquid supply member being aligned with the fastening body and a length direction of the support bady.
2. The substrate treating apparatus of claim 1, wherein the liquid supply member comprises:
at least one first nozzle, each first nozzle supplying the wetting liquid to a first region of the substrate placed on the body; and at least one second nozzle, each second nozzle supplying the wetting liquid to a second region, which is a region different from the first region, of the substrate placed on the body.

3. The substrate treating apparatus of claim 2, wherein a spray distance of the wetting liquid supplied from the first nozzle is different from a spray distance of the wetting liquid supplied from the second nozzle.

4. The substrate treating apparatus of claim 3, wherein a distance between the first region and the first nozzle is shorter than a distance between the second region and the second nozzle, the first region and the second region are an edge region of the substrate, and the spray distance of the wetting liquid supplied from the first nozzle is shorter than the spray distance of the wetting liquid supplied from the second nozzle.

5. The substrate treating apparatus of claim 4, wherein a diameter of a spray hole of the first nozzle is larger than a diameter of a spray hole of the second nozzle.

6. The substrate treating apparatus of claim 5, wherein a supply flow rate of the wetting liquid transferred to the first nozzle per unit time is same as a supply flow rate of the wetting liquid transferred to the second nozzle per unit time.

7. The substrate treating apparatus of claim 2, wherein the hand comprises:

a chucking body configured to chuck the substrate placed on the support body.

8. The substrate treating apparatus of claim 7, wherein the liquid supply member is installed on the support body.

9. The substrate treating apparatus of claim 7, wherein the fastening body is configured to couple the chucking body and the support body to the joint portion.

10. The substrate treating apparatus of claim 9, wherein the liquid supply member is installed on the fastening body.

11. The substrate treating apparatus of claim 10, wherein the liquid supply member is a supply pipe at which the first nozzle and the second nozzle are formed.

12. The substrate treating apparatus of claim 9, wherein the liquid supply member is fastened to the joint portion and configured to supply the wetting liquid to a center region of the substrate placed on the support body.

13. A substrate treating apparatus comprising:

a first process treating unit configured to treat a substrate in a batch-type manner; and a second process treating unit configured to treat the substrate in a single-type manner, and wherein the first process treating unit comprises:

a posture changing treating bath configured to have an accommodation space for accommodating a liquid;

a support member configured to support at least one substrate in a vertical posture at the accommodation space; and a posture changing robot configured to change a posture of a substrate immersed in the liquid from the vertical posture to a horizontal posture, the posture changing robot having a body for holding the substrate, the body including a joint portion, and a hand coupled to the joint portion, the hand including a fastening body configured to couple the hand to the joint portion and a support body configured to support the substrate, an arm for changing a position of the body, and a liquid supply member for supplying a wetting liquid to the substrate placed on the body, the liquid supply member being aligned with the fastening body and a length direction of the support body.

14. The substrate treating apparatus of claim 13, wherein the liquid supply member comprises:

at least one first nozzle for supplying the wetting liquid to a first region of the substrate placed on the body; and at least one second nozzle for supplying the wetting liquid to a second region, which is a different region from the first region, of the substrate placed on the support body.

15. The substrate treating apparatus of claim 14, wherein a spray distance of the wetting liquid supplied from the first nozzle is different from a spray distance of the wetting liquid supplied from the second nozzle.

16. The substrate treating apparatus of claim 15, wherein a distance between the first region and the first nozzle is shorter than a distance between the second region and the second nozzle, and the first region and the second region are an edge region of the substrate, and a spray distance of the wetting liquid supplied from the first nozzle is shorter than a spray distance of the wetting liquid supplied from the second nozzle.

17. The substrate treating apparatus of claim 16, wherein a diameter of a spray hole of the first nozzle is smaller than a diameter of a spray hole of the second nozzle.

18. The substrate treating apparatus of claim 17, wherein a supply flow rate of the wetting liquid transferred to the first nozzle per unit time is same as a supply flow rate of the wetting liquid transferred to the second nozzle per unit time.

19. A substrate treating apparatus comprising:

a first process treating unit configured to treat a substrate in a batch-type manner;

a second process treating unit configured to treat the substrate in a single-type manner; and a controller, wherein the first process treating unit comprises:

a batch-type treating bath configured to treat the substrates in a vertical posture;

a posture changing treating bath configured to change a posture of the substrate in the vertical posture to a horizontal posture, the posture changing treating bath having an accommodation space for accommodating a liquid and a support member for supporting the substrate at the accommodation space in the vertical posture; and a posture changing robot configured to change the posture of the substrate immersed in the liquid from the vertical posture to the horizontal posture, the posture changing robot having a body for holding the substrate, the body including a joint portion; and a hand coupled to the joint portion, the hand including a fastening body configured to couple the hand to the joint portion and a support body configured to support the substrate, an arm for changing a position of the body, and a liquid supply member for supplying a wetting liquid to the substrate placed on the body, the liquid supply member being aligned with the fastening body and a length direction of the support body, and wherein the second process treating unit comprises:

a single-type treating chamber configured to treat the substrate in the horizontal posture;

a buffer unit configured to provide a space for temporarily storing the substrate; and a transfer robot configured to transfer the substrate between the buffer unit and the single-type treating chamber, and wherein the controller is configured to control the posture changing robot so the posture changing robot may complete a posture changing of the substrate and transfer a substrate which posture has been changed to the buffer unit.

20. The substrate treating apparatus of claim 19, wherein the controller is configured to control the posture changing robot so the posture changing of the substrate is complete, the substrate is moved so the substrate deviates from the liquid stored at the posture changing treating bath, and the wetting liquid is supplied to the substrate by the liquid supply member if the substrate deviates from the liquid.

\* \* \* \* \*